United States Patent
Watabe et al.

(10) Patent No.: US 10,249,837 B2
(45) Date of Patent: *Apr. 2, 2019

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Atsugi-shi, Kanagawa-ken (JP)

(72) Inventors: Takeyoshi Watabe, Atsugi (JP); Satoshi Seo, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/278,379

(22) Filed: Sep. 28, 2016

(65) Prior Publication Data

US 2017/0018727 A1    Jan. 19, 2017

Related U.S. Application Data

(63) Continuation of application No. 14/718,689, filed on May 21, 2015, now Pat. No. 9,461,259, which is a (Continued)

(30) Foreign Application Priority Data

Mar. 26, 2013   (JP) .................. 2013-063634

(51) Int. Cl.
*H01L 29/08* (2006.01)
*H01L 51/50* (2006.01)
(Continued)

(52) U.S. Cl.
CPC .......... *H01L 51/504* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS 6,911,271 B1    6/2005  Lamansky et al.
6,939,624 B2    9/2005  Lamansky et al.
(Continued)

FOREIGN PATENT DOCUMENTS

CN    001454448 A    11/2003
CN    101006594 A    7/2007
(Continued)

OTHER PUBLICATIONS

International Search Report (Application No. PCT/JP2014/058708) dated Jun. 3, 2014.
(Continued)

*Primary Examiner* — Hung Vu
(74) *Attorney, Agent, or Firm* — Robinson Intellectual Property Law Office; Eric J. Robinson

(57) ABSTRACT

Provided is a light-emitting element having a light-emitting layer which contains at least a host material and a plurality of guest materials, where the host material has a lower T1 level than that of at least one of the plurality of guest materials. The emission of the one of the plurality of guest materials exhibits a multicomponent decay curve, and the lifetime thereof is less than or equal to 15 μsec, preferably less than or equal to 10 μsec, more preferably less than or equal to 5 μsec, where the lifetime is defined as a time for the emission to decrease in intensity to $^{1}/_{100}$ of its initial intensity.

20 Claims, 14 Drawing Sheets

First Guest material 12    Host material 11

Related U.S. Application Data continuation of application No. 14/220,535, filed on Mar. 20, 2014, now Pat. No. 9,082,994.

(51) Int. Cl.
*C09K 11/02* (2006.01)
*C09K 11/06* (2006.01)
*H01L 51/00* (2006.01)

(52) U.S. Cl.
CPC ...... *H01L 51/5004* (2013.01); *H01L 51/5012* (2013.01); *H01L 51/5016* (2013.01); *H01L 51/5036* (2013.01); *C09K 2211/1007* (2013.01); *C09K 2211/1044* (2013.01); *C09K 2211/185* (2013.01); *H01L 51/006* (2013.01); *H01L 51/0052* (2013.01); *H01L 51/0061* (2013.01); *H01L 51/0072* (2013.01); *H01L 51/0074* (2013.01); *H01L 51/0085* (2013.01); *H01L 2251/552* (2013.01)

(56) References Cited

U.S. PATENT DOCUMENTS

| | | | |
|---|---|---|---|
| 7,374,828 B2 | 5/2008 | Kondakova et al. | |
| 7,381,479 B2 | 6/2008 | Lamansky et al. | |
| 7,466,073 B2* | 12/2008 | Kishino | C09K 11/06 313/504 |
| 7,553,560 B2 | 6/2009 | Lamansky et al. | |
| 7,906,226 B2 | 3/2011 | Matsuura et al. | |
| 8,105,701 B2 | 1/2012 | Matsuura et al. | |
| 8,470,455 B2 | 6/2013 | Matsuura et al. | |
| 8,643,268 B2 | 2/2014 | Ogiwara et al. | |
| 9,082,994 B2 | 7/2015 | Watabe et al. | |
| 9,391,290 B2 | 7/2016 | Watabe et al. | |
| 9,461,259 B2* | 10/2016 | Watabe | H01L 51/5012 |
| 9,634,267 B2 | 4/2017 | Watabe et al. | |
| 9,935,286 B2 | 4/2018 | Watabe et al. | |
| 2002/0182441 A1 | 12/2002 | Lamansky et al. | |
| 2006/0040132 A1 | 2/2006 | Liao | |
| 2006/0066225 A1 | 3/2006 | Kishino et al. | |
| 2008/0149923 A1 | 6/2008 | Ohsawa et al. | |
| 2012/0205687 A1 | 8/2012 | Yamazaki et al. | |
| 2013/0240851 A1 | 9/2013 | Seo | |
| 2014/0191220 A1 | 7/2014 | Watabe et al. | |

FOREIGN PATENT DOCUMENTS

| | | |
|---|---|---|
| EP | 2493269 A | 8/2012 |
| EP | 2566302 A | 3/2013 |
| JP | 2004-506305 | 2/2004 |
| JP | 2006-128632 A | 5/2006 |
| JP | 2007-515788 | 6/2007 |
| JP | 2007-305783 A | 11/2007 |
| JP | 2008-511100 | 4/2008 |
| JP | 2010-090084 A | 4/2010 |
| JP | 2010-182699 A | 8/2010 |
| JP | 2010-184910 A | 8/2010 |
| JP | 2012-167046 A | 9/2012 |
| JP | 6335510 | 5/2018 |
| KR | 2007-0043014 A | 4/2007 |
| KR | 10-0884039 | 2/2009 |
| KR | 10-1134412 | 4/2012 |
| TW | 593625 | 6/2004 |
| WO | WO-2002/015645 | 2/2002 |
| WO | WO-2006/023322 | 3/2006 |
| WO | WO-2013/031345 | 3/2013 |
| WO | WO-2014/109274 | 7/2014 |

OTHER PUBLICATIONS

Written Opinion (Application No. PCT/JP2014/058708) dated Jun. 3, 2014.

Tanaka.H et al., "Efficient green thermally activated delayed fluorescence (TADF) from a phenoxazine-triphenyltriazine (PXZ-TRZ) derivative", Chemical Communications, Dec. 4, 2012, vol. 48, No. 93, pp. 11392-11394, The Royal Society of Chemistry 2012.

Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.

* cited by examiner

LIGHT-EMITTING ELEMENT, LIGHT-EMITTING DEVICE, ELECTRONIC DEVICE, AND LIGHTING DEVICE

TECHNICAL FIELD

One embodiment of the present invention relates to a light-emitting element in which an organic compound that emits light by application of an electric field is provided between a pair of electrodes, and also relates to a light-emitting device, an electronic device, and a lighting device including such a light-emitting element.

BACKGROUND ART

A light-emitting element using an organic compound as a luminous body, which has features such as thinness, lightness, high-speed response, and DC drive at low voltage, is expected to be applied to a next-generation flat panel display. In particular, a display device in which light-emitting elements are arranged in a matrix is considered to have advantages in a wide viewing angle and excellent visibility over a conventional liquid crystal display device.

A light-emitting element is considered to have the following emission mechanism: when voltage is applied between a pair of electrodes with an EL layer containing a light-emitting substance provided therebetween, electrons injected from a cathode and holes injected from an anode form an excited state in an emission region of the EL layer, and energy is released and light is emitted when the excited state returns to a ground state. In the case of using an organic compound as a light-emitting substance, there can exist in two types of excited states: a singlet excited state and a triplet excited state. Luminescence from the singlet excited state (S1) is referred to as fluorescence, and luminescence from the triplet excited state (T1) is referred to as phosphorescence. The statistical generation ratio of the excited states in the light-emitting element is considered that S1:T1=1:3.

Development for improving element characteristics has been conducted; for example, a light-emitting element having a structure utilizing not only fluorescence but also phosphorescence has been developed. In a light-emitting layer of the light-emitting element, a host material and a guest material are contained, and a phosphorescent material exhibiting high energy emission is used as the guest material (e.g., see Patent Document 1).

REFERENCE

Patent Document

[Patent Document 1] Japanese Published Patent Application No. 2010-182699

DISCLOSURE OF INVENTION

In general, it is thought that to improve the emission efficiency of a light-emitting element using a host material and a guest material, the T1 level of the host material is preferably higher than that of the guest material. In the case where a phosphorescent compound having high emission energy (e.g., a blue phosphorescent compound) is used as a guest material, a host material needs to have higher T1 level than in the case where phosphorescent compound having lower emission energy is used as a guest material; thus, its reliability as a host material decreases.

In view of the above background, one embodiment of the present invention provides a novel light-emitting element which shows high reliability even if a phosphorescent compound having high emission energy is employed. Specifically, disclosed is a light-emitting element including a light-emitting layer containing at least a host material and a plurality of guest materials, where emission obtained from the light-emitting layer (including photoluminescence (PL) by photoexcitation or electroluminescence (EL) by electric field excitation) exhibits a multicomponent decay curve expressed by Formula 1 (provided that i≠1) and the emission lifetime is short enough to prevail the thermal deactivation process of the host material. Note that, in the specification and claims, the emission lifetime means a time required for the emission intensity to decrease to $1/100$ of the initial value. The emission lifetime which is short enough to prevail the thermal deactivation process of the host material is specifically more than or equal to 5 μsec and less than or equal to 15 μsec, preferably more than or equal to 5 μsec and less than or equal to 10 μsec. The exciton concentration in the light-emitting layer is in a range where concentration quenching does not occur.

Under the above conditions, energy transfer from the host material to the guest material is possible even when the T1 level of the host material is lower than the T1 level of the guest material. Hence, a material having a low T1 level can be used as the host material because the T1 level of the host material is not necessarily required to be higher than that of the guest material. Additionally, such an element structure enables the improvement of reliability of a light-emitting element compared with that using a material with higher T1 level than a guest material.

$$E(t)/E_0 = \sum_{i=1}^{n} A_i \exp(-t/\tau_i) \qquad (1)$$

(where $E_0$ indicates an initial emission intensity, $E(t)$ indicates an emission intensity at time (t), A is a constant, τ indicates a lifetime of the each decay component, and n indicates the number of components of a decay curve.)

Accordingly, one embodiment of the present invention is a light-emitting element including a light-emitting layer containing at least a host material and a plurality of guest materials. One of emissions obtained by irradiating the light-emitting layer with excitation light (the output level is set not to cause concentration quenching) shows a multicomponent decay curve and has an emission lifetime more than or equal to 5 μsec and less than or equal to 15 μsec, preferably more than or equal to 5 μsec and less than or equal to 10 μsec.

Another embodiment of the present invention is a light-emitting element including a pair of electrodes and a light-emitting layer between the pair of electrodes. The light-emitting layer exhibits a plurality of emissions by photoexcitation. One of the emissions shows a multicomponent decay curve, and an emission lifetime thereof is more than or equal to 5 μsec and less than or equal to 15 μsec.

Another embodiment of the present invention is a light-emitting element including at least a light-emitting layer between a pair of electrodes. The light-emitting layer contains two kinds of light-emitting substances. Emission obtained from one of the light-emitting substances shows a multicomponent decay curve, and an emission lifetime thereof is more than or equal to 5 μsec and less than or equal to 15 μsec.

Another embodiment of the present invention is a light-emitting element including at least a light-emitting layer between a pair of electrodes. The light-emitting layer contains at least a first organic compound (host material), a second organic compound (guest material), and a third organic compound (guest material). Each of the second organic compound and the third organic compound is an organometallic complex. The T1 level of the first organic compound is lower than the T1 level of the second organic compound. The T1 level of the first organic compound is higher than the T1 level of the third organic compound. Emission obtained from the second organic compound shows a multicomponent decay curve, and an emission lifetime thereof is more than or equal to 5 μsec and less than or equal to 15 μsec.

In each of the above structures, an organic compound whose T1 level is lower than that of the guest material can be used as the host material; thus, the light-emitting element can be fabricated without using an organic compound having low reliability as a host material.

In the structures where the T1 level of the host material is lower than the T1 level of the guest material, the difference in T1 level between the host material and the guest material is greater than 0 eV and less than or equal to 0.2 eV. Accordingly, a material having high reliability as a host material can be used without decreasing emission efficiency, leading to a long-lifetime light-emitting element.

Other embodiments of the present invention are not only a light-emitting device including the light-emitting element but also an electronic device and a lighting device each including the light-emitting device. Accordingly, a light-emitting device in this specification refers to an image display device or a light source (including a lighting device). In addition, the light-emitting device includes, in its category, all of a module in which a light-emitting device is connected to a connector such as a flexible printed circuit (FPC) or a tape carrier package (TCP), a module in which a printed wiring board is provided on the tip of a TCP, and a module in which an integrated circuit (IC) is directly mounted on a light-emitting element by a chip on glass (COG) method.

A light-emitting element of one embodiment of the present invention can have high emission efficiency. A light-emitting element of one embodiment of the present invention can have a long lifetime by including a material with high reliability as a host material in a light-emitting layer. A light-emitting device of one embodiment of the present invention can have high reliability by including the light-emitting element. An electronic device and a lighting device of one embodiment of the present invention can have high reliability by including the light-emitting device.

BEST MODE FOR CARRYING OUT THE INVENTION

Hereinafter, embodiments of the present invention will be described with reference to the drawings. Note that the present invention is not limited to the following description, and modes and details thereof can be modified in various ways without departing from the spirit and the scope of the present invention. Therefore, the present invention should not be construed as being limited to the description in the following embodiments.

Embodiment 1

In this embodiment, a light-emitting element of one embodiment of the present invention is described.

A light-emitting element of one embodiment of the present invention includes a light-emitting layer between a pair of electrodes. The light-emitting layer contains at least a host material and a plurality of guest materials. A combination of the host material and one of the guest materials in the light-emitting layer is arranged so that emission (e.g., photoluminescence (PL) by photoexcitation or electroluminescence (EL) by electric field excitation) obtained from the light-emitting layer shows a multicomponent decay curve and the emission lifetime thereof is short enough to prevail the thermal deactivation process of the host material (preferably more than or equal to 5 μsec and less than or equal to 15 μsec). The light-emitting element with such a structure can have sufficiently high emission efficiency.

The above-mentioned light-emitting layer is structured so that the T1 level of the host material is lower than that of the guest material (hereinafter, referred to as a first guest material for convenience sake). In the above structure, energy transfer from the host material to the first guest material is possible even if the T1 level of the host material is lower than that of the first guest material, and the T1 level of the host material is not necessarily required to be higher than that of the guest material; thus, a material with high reliability as a host material can be used. Accordingly, in one embodiment of the present invention, the host material whose T1 level is lower than that of the first guest material can be used.

The T1 level of another guest material (hereinafter, referred to as a second guest material for convenience sake) is lower than that of the host material.

With the application of the above structure, a material with high reliability as a host material in the light-emitting layer can be used and two or more kinds of lights having different wavelengths can be obtained in the light-emitting layer.

Next, the energy transfer process between the host material and the guest material in the light-emitting layer in the light-emitting element of one embodiment of the present invention is described with reference to FIG. 1A.

Figure 1:
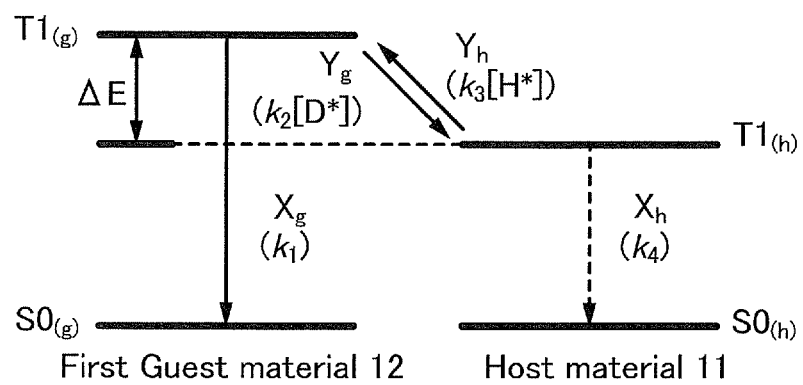
FIG. 1 illustrates a concept of one embodiment of the present invention.

FIG. 1A illustrates energy levels of excitons of a host material 11 and a first guest material 12 which are included in the light-emitting layer. $T1_{(g)}$ is the triplet excited state of the first guest material 12, and $T1_{(h)}$ is the triplet excited state of the host material 11 that is lower than the $T1_{(g)}$ level by $\Delta E(eV)$.

In this case, an energy of the $T1_{(g)}$ of the first guest material 12 transfers ($Y_g$) to the $T1_{(h)}$ of the host material 11 at a rate of $k_2 \times [D^*]$. Note that $[D^*]$ represents the concentration of excitons of the first guest material, and $k_2$ represents a rate constant of energy transfer from the first guest material 12 to the host material 11. Furthermore, energy can transfer ($Y_h$) from the $T1_{(h)}$ of the host material 11 to the $T1_{(g)}$ of the first guest material 12 at a rate of $k_3 \times [H^*]$. Note that $[H^*]$ represents the concentration of excitons of the host material, and $k_3$ represents a rate constant of energy transfer from the host material 11 to the first guest material 12. In other words, an equilibrium is established between $Y_h$ and $Y_g$. This thermodynamically disadvantageous energy transfer from the low level to the high level (hereinafter, referred to as reverse energy transfer) can occur because excitons are activated by energy of room temperature. Note that in FIG. 1A, $k_1$ represents a rate constant of transition from the $T1_{(g)}$ to an $S0_{(g)}$ of the first guest material 12, and $k_4$ represents a rate constant of transition from the $T1_{(h)}$ to an $S0_{(h)}$ of the host material 11.

Here, the embodiment of the present invention provides a combination of the host material 11 and the first guest material 12 so that the energy difference between the $T1_{(g)}$ and the $T1_{(h)}$ satisfies the formula $0 < \Delta E \leq 0.2$ eV. Therefore, the energy transfer ($Y_g$) from the $T1_{(g)}$ to the $T1_{(h)}$ proceeds.

When the above-mentioned energy transfers occur, radiative transition ($X_g$) from the $T1_{(g)}$ to the $S0_{(g)}$ of the first guest material 12 and non-radiative transition (thermal deactivation process $X_h$) from the $T1_{(h)}$ to the $S0_{(h)}$ of the host material 11 also occur at the same time. At this time, it is also important for highly efficient light emission that the rate of the radiative transition ($X_g$) be relatively high and the rate of the non-radiative transition ($X_h$) be significantly low. Specifically, it is preferable that a rate constant $k_1$ of the radiative transition ($X_g$) be larger than $5.0 \times 10^5$ (sec$^{-1}$), and a rate constant $k_4$ of the non-radiative transition ($X_h$) be smaller than $1 \times 10^2$ (sec$^{-1}$).

That is, the equilibrium between the $Y_h$ and $Y_g$ is shifted to the side of the first guest by utilizing the rapid radiative transition ($X_g$), slow non-radiative transition ($X_h$), and the small $\Delta E$, which realizes the highly efficient light emission.

As described above, since a light-emitting element of one embodiment of the present invention also utilizes energy that reversely transfers from a low level for its light emission, the emission from the light-emitting layer shows a multicomponent decay curve. The lifetime of the emission is short enough to prevail the thermal deactivation process of the host material (less than or equal to 15 μsec, preferably less than or equal to 10 μsec, more preferably less than or equal to 5 μsec); thus, sufficiently high emission efficiency can be obtained.

Note that even in the case where a light-emitting layer does not possesses the aforementioned relation regarding the energy levels, a multicomponent decay curve is obtained when measurement is performed in a state where output of excitation light is set high to provide high concentration of the exciton. This is because the high exciton concentration causes the interaction among excitons, leading to the triplet-triplet extinction. This phenomenon is called concentration quenching. The measurement is therefore performed in a state where output of excitation light is set low to make the exciton concentration low for preventing influence of concentration quenching.

Next, a structure of a light-emitting element of one embodiment of the present invention is described with reference to FIG. 2.

Figure 2:
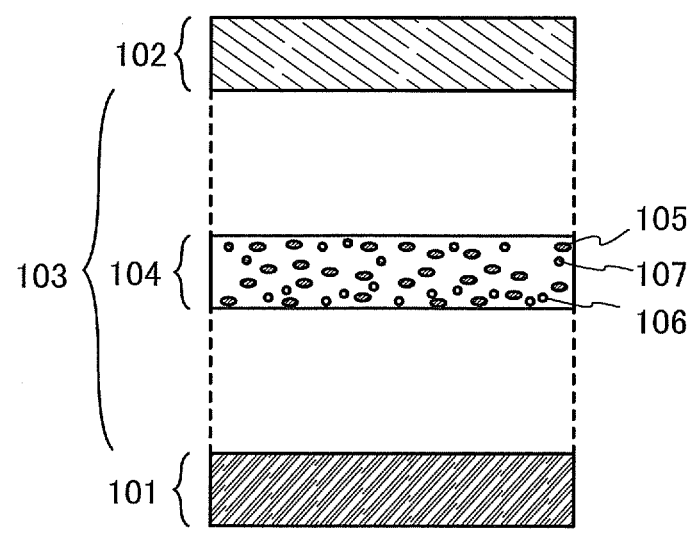
FIG. 2 illustrates a structure of a light-emitting element.

As illustrated in FIG. 2, the light-emitting element of one embodiment of the present invention has a structure in which a light-emitting layer 104 containing a first organic compound and a second organic compound is provided between a pair of electrodes (an anode 101 and a cathode 102). The light-emitting layer 104 is one of functional layers included in an EL layer 103 that is in contact with the pair of electrodes. The EL layer 103 can include, in addition to the light-emitting layer 104, any of a hole-injection layer, a hole-transport layer, an electron-transport layer, an electron-injection layer, and the like as appropriate at desired positions. Note that the light-emitting layer 104 contains at least a first organic compound 105 serving as the host material, a second organic compound 106 serving as the first guest material, and a third organic compound 107 serving as the second guest material.

A material having an excellent hole-transport property or a material having an excellent electron-transport property can be used as the first organic compound 105 serving as a host material.

Examples of the material having an excellent hole-transport property that can be used as the first organic compound 105 include aromatic amine compounds such as 4-(1-naphthyl)-4'-phenyl-4"-(9-phenyl-9H-carbazol-3-yl)triphenylamine (abbreviation: PCBBiNB), 4-phenyl-4'-(9-phenyl-9H-carbazol-3-yl)triphenylamine (abbreviation: PCBA1BP), 4,4'-di(1-naphthyl)-4"-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4"-tris[N-(1-naphthyl)-N-phenylamino]triphenylamine (abbreviation: 1'-TNATA), 2,7-bis[N-(4-diphenylaminophenyl)-N-phenylamino]spiro-9,9'-bifluorene (abbreviation: DPA2SF), N,N'-bis(9-phenyl-carbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N"-triphenyl-N,N',N"-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 4,4'-bis[N-(1-naphthyl)-N-phenylamino]biphenyl (abbreviation: NPB or α-NPD), N,N'-bis(3- methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N-(3-methylphenyl)-N'-phenylamino]phenyl}-N-phenylamino)biphenyl (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2). In addition, the following compounds including a carbazole skeleton can be used, for example: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). The substances mentioned here are mainly ones that have a hole mobility of $10^{-6}$ cm$^2$/Vs or higher. Note that any substance other than the above substances may be used as long as it has a hole-transport property.

Examples of the material having an excellent electron-transport property that can be used as the first organic compound 105 include the followings: heterocyclic compounds having polyazole skeletons, such as 2-(4-biphenylyl)-5-(4-tert-butylphenyl)-1,3,4-oxadiazole (abbreviation: PBD), 3-(4'-tert-butylphenyl)-4-phenyl-5-(4''-biphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having quinoxaline skeletons or dibenzoquinoxaline skeletons, such as 2-[3-(dibenzothiophen-4-yl)phenyl]dibenzo[f,h]quinoxaline (abbreviation: 2mDBTPDBq-II), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3'-(dibenzothiophen-4-yl)biphenyl-3-yl]dibenzo[f,h]quinoxaline (abbreviation: 2mDBTBPDBq-II), and 2-[3'-(9H-carbazol-9-yl)biphenyl-3-yl]dibenzo[f,h]quinoxaline (abbreviation: 2mCzBPDBq); heterocyclic compounds having diazine skeletons (pyrimidine skeletons or pyrazine skeletons), such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); and heterocyclic compounds having pyridine skeletons, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), and 3,3',5,5'-tetra[(m-pyridyl)-phen-3-yl]biphenyl (abbreviation: BP4mPy). Among the above-described compounds, the heterocyclic compounds having quinoxaline skeletons or dibenzoquinoxaline skeletons, the heterocyclic compounds having diazine skeletons, and the heterocyclic compounds having pyridine skeletons have high reliability and are thus preferable. Other examples of the material having an excellent electron-transport property include the followings: triarylphosphine oxides, such as phenyl-di(1-pyrenyl)phosphine oxide (abbreviation: POPy$_2$), spiro-9,9'-bifluoren-2-yl-diphenylphosphine oxide (abbreviation: SPPO1), 2,8-bis(diphenylphosphoryl)dibenzo[b,d]thiophene (abbreviation: PPT), and 3-(diphenylphosphoryl)-9-[4-(diphenylphosphoryl)phenyl]-9H-carbazole (abbreviation: PPO21); and triarylborane such as tris[2,4,6-trimethyl-3-(3-pyridyl)phenyl]borane (abbreviation: 3TPYMB). The substances mentioned here have an electron-transport property and are mainly ones that have an electron mobility of $10^{-6}$ cm$^2$/Vs or more. Note that any substance other than the above substances may be used as long as it has an electron-transport property.

Note that the light-emitting layer may contain a fourth organic compound in addition to the first organic compound (the host material), the second organic compound (the first guest material), and the third organic compound (the second guest material). To obtain high emission efficiency by adjustment of a balance between holes and electrons in the light-emitting layer, when the first organic compound has a hole-transport property, the fourth organic compound preferably has an electron-transport property. In contrast, when the first organic compound has an electron-transport property, the fourth organic compound preferably has a hole-transport property. In either case, it is preferable that the $T1_{(h)}$ level of the first organic compound be lower than the $T1_{(g)}$ level of the second organic compound and higher than the $T1_{(g)}$ level of the third organic compound. However, in the case where the T1 level of the fourth organic compound is lower than the $T1_{(g)}$ level of the first organic compound, the above-mentioned interaction between a host material and a guest material occurs between the fourth organic compound and the second organic compound, and between the fourth organic compound and the third organic compound. Accordingly, it is preferable that the T1 level of the fourth organic compound be lower than that of the second organic compound and higher than that of the third organic compound. This is because when two or more materials other than a light-emitting guest material exist, energy preferentially transfers therebetween from higher T1 to lower T1.

As the second organic compound 106 and the third organic compound 107 which serve as guest materials, an organometallic complex (a phosphorescent compound) that is a light-emitting substance converting triplet excitation energy into light emission can be used, for example. Examples of the material that can be used as the second organic compound 106 and the third organic compound 107 include bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis[2-(3',5'-bistrifluoromethylphenyl)pyridinato-N,C$^{2'}$]iridium(III) picolinate (abbreviation: [Ir(CF$_3$ppy)$_2$(pic)]), bis[2-(4',6'-difluorophenyl)pyridinato-N,C$^{2'}$]iridium(III) acetylacetonate (abbreviation: FIracac), tris(2-phenylpyridinato)iridium(III) (abbreviation: [Ir(ppy)$_3$]), bis(2-phenylpyridinato)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), bis(2,4-diphenyl-1,3-oxazolato-N,C$^{2'}$)iridium(III) acetylacetonate (abbreviation: [Ir(dpo)$_2$(acac)]), (acetylacetonato)bis(6-tert-butyl-4-phenylpyrimidinato)iridium(III) (abbreviation: Ir(tBuppm)$_2$(acac)), bis{2-[4'-(perfluorophenyl)phenyl]pyridinato-N,C$^{2'}$}iridium(III) acetylacetonate (abbreviation: [Ir(p-PF-ph)$_2$(acac)]), bis(2-phenylbenzothiazolato-N,C$^{2'}$)iridium(III)acetylacetonate (abbreviation: [Ir(bt)$_2$(acac)]), bis[2-(2'-benzo[4,5-α]thienyl)pyridinato-N,C$^{3'}$]iridium(III) acetyl acetonate (abbreviation: [Ir(btp)$_2$(acac)]), bis(1-phenylisoquinolinato-N,C$^{2'}$)iridium(III)acetylacetonate (abbreviation: [Ir(piq)$_2$(acac)]), (acetylacetonato)bis[2,3-bis(4-fluorophenyOquinoxalinato]iridium(III) (abbreviation: [Ir(Fdpq)$_2$(acac)]), (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: Ir(tppr)$_2$(dpm)), 2,3,7,8,12,13,17,18-octaethyl-21H,23H-porphineplatinum(II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

The host material and the first guest material contained in the light-emitting layer of the light-emitting element described in this embodiment satisfy following conditions: the emission (e.g., photoluminescence (PL) by photoexcitation or electroluminescence (EL) by electric field excitation) obtained from their combination shows a multicomponent decay curve; and the lifetime thereof is short enough to prevail the thermal deactivation process of the host material (more than or equal to 5 µsec and less than or equal to 15 µsec, preferably more than or equal to 5 µsec and less than or equal to 10 µsec). This structure provides sufficiently high emission efficiency. Furthermore, in the light-emitting layer, the third organic compound 107 (the second guest material) can emit light using the same host material. Since the host material is used in common for different guest materials, an intermolecular carrier-injection barrier between the host materials is not formed; as a result, a plurality of lights having different wavelengths can be obtained from the light-emitting layer without increasing driving voltage.

In the light-emitting element in this embodiment, the T1 level of the host material (the first organic compound 105) is lower than the T1 level of the first guest material (the second organic compound 106), and higher than the T1 level of the second guest material (the third organic compound 107). The emission from a plurality of guest materials in the same host material is resulted from energy transfer to the second organic compound 106 serving as first a guest material, which occurs even when the T1 level of the first organic compound 105 is lower than that of the second organic compound 106. Hence, the T1 level of the host material can be lower than that of a generally-used host material, which allows the use of a material with high reliability as a host material. Therefore, the light-emitting element can have a long lifetime.

The structure of this embodiment exhibits the delayed light emission associated with reverse energy transfer between the host material and the first guest material whose T1 level is higher than that of the host material. Since the host material in the T1 is non-radiative at room temperature, it is concerned that a light-emitting layer exhibiting delayed light emission causes low efficiency. However, the reverse energy transfer is allowed due to the aforementioned small difference in T1 level, and the rate of the transition (radiative deactivation rate) of the guest material is sufficiently higher than the rate of the transition (non-radiative deactivation rate) of the host material; thus, element characteristics are not affected and a light-emitting element having high emission efficiency can be obtained.

Embodiment 2

In this embodiment, an example of a light-emitting element of one embodiment of the present invention is described with reference to FIG. 3.

Figure 3:
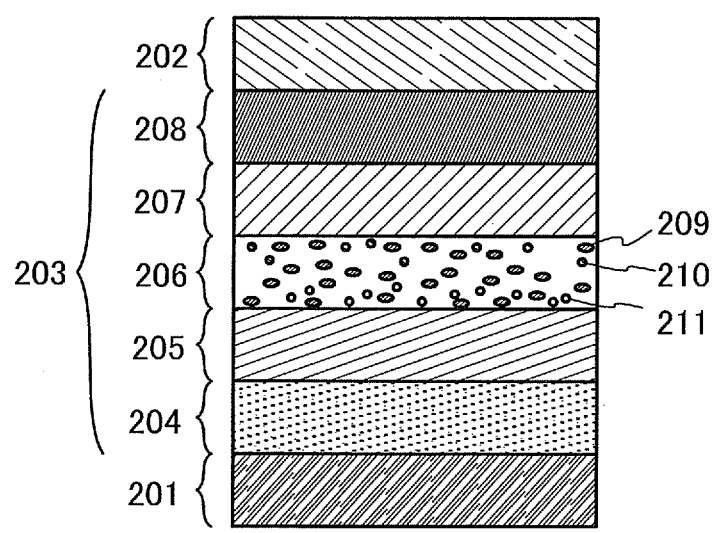
FIG. 3 illustrates a structure of a light-emitting element.

In the light-emitting element described in this embodiment, as illustrated in FIG. 3, an EL layer 203 including a light-emitting layer 206 is provided between a pair of electrodes (a first electrode (anode) 201 and a second electrode (cathode) 202), and the EL layer 203 includes a hole-injection layer 204, a hole-transport layer 205, an electron-transport layer 207, an electron-injection layer 208, and the like in addition to the light-emitting layer 206.

As in the light-emitting element described in Embodiment 1, the light-emitting layer 206 contains at least the first organic compound serving as the host material, the second organic compound serving as the first guest material, and the third organic compound serving as the second guest material. Since the same substances described in Embodiment 1 can be used as the first organic compound, the second organic compound, and the third organic compound, description thereof is omitted.

In addition to the first organic compound serving as the host material, the second organic compound serving as the first guest material, and the third organic compound serving as the second guest material, the light-emitting layer 206 may also contain the fourth organic compound having a carrier-transport property opposite to that of the first organic compound (a hole-transport property or an electron-transport property).

Next, a specific example in manufacturing the light-emitting element described in this embodiment is described.

For the first electrode (anode) 201 and the second electrode (cathode) 202, a metal, an alloy, an electrically conductive compound, a mixture thereof, or the like can be used. Specifically, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), or titanium (Ti) can be used. In addition, an element belonging to Group 1 or Group 2 of the periodic table, for example, an alkali metal such as lithium (Li) or cesium (Cs), an alkaline earth metal such as magnesium (Mg), calcium (Ca), or strontium (Sr), an alloy containing such an element (e.g., MgAg or AlLi), a rare earth metal such as europium (Eu) or ytterbium (Yb), an alloy containing such an element, or graphene can be used. The first electrode (anode) 201 and the second electrode (cathode) 202 can be formed by, for example, a sputtering method or an evaporation method (including a vacuum evaporation method).

Examples of a material having an excellent hole-transport property that can be used for the hole-injection layer 204 and the hole-transport layer 205 include aromatic amine compounds such as NPB, TPD, TCTA, TDATA, MTDATA, BSPB; and 4-phenyl-4'-(9-phenylfluoren-9-yl)triphenylamine (abbreviation: BPAFLP); carbazole derivatives such as PCzPCA1, PCzPCA2, and PCzPCN1), CBP, TCPB, and CzPA; and dibenzothiophene derivatives such as 1,3,5-tri(dibenzothiophen-4-yl)benzene (abbreviation: DBT3P-II). The substances mentioned here are mainly materials having a hole mobility of $10^{-6}$ cm$^2$/Vs or higher. Note that substances other than the above substances may be used as long as the hole-transport property is higher than the electron-transport property.

Alternatively, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacryla mide] (abbreviation: PTPDMA), or poly[N,N'- bis(4-butylphenyl)-N,N'-bis(phenyl)benzidine] (abbreviation: Poly-TPD) can be used.

The hole-injection layer 204 may be doped with a substance serving as an electron acceptor (acceptor) to the substance having a high hole-transport property. As examples of the acceptor, an oxide of a metal belonging to any of Group 4 to Group 8 of the periodic table can be given. Specifically, molybdenum oxide is particularly preferable.

The light-emitting layer 206 contains, as described above, at least the first organic compound 209 serving as the host material, the second organic compound 210 serving as the first guest material, and the third organic compound 211 serving as the second guest material.

Note that for the hole-transport layer 205 in contact with the light-emitting layer 206, a compound similar to the organic compound contained in the light-emitting layer is preferably used. With this structure, the hole-injection barrier between the hole transport layer 205 and the light-emitting layer 206 can be reduced, which can increase emission efficiency and reduce driving voltage. That is, a light-emitting element having a small decrease in power efficiency due to voltage loss can be obtained. A particularly preferable mode for reducing the hole-injection barrier is a structure in which the hole-transport layer 205 contains the first organic compound as the light-emitting layer.

The electron-transport layer 207 is a layer containing a material having an excellent electron-transport property. For the electron-transport layer 207, a metal complex such as tris(8-quinolinolato)aluminum(III) (abbreviation: Alq$_3$), tris (4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis [2-2(hydroxyphenyl)benzoxazolato]zinc(II) (abbreviation: Zn(BOX)$_2$), or bis[2-(2-hydroxyphenyObenzothiazolato] zinc(II) (abbreviation: Zn(BTZ)$_2$) can be used. Further, a heteroaromatic compound such as PBD, OXD-7, TAZ, 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used. A high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances given here are mainly ones having an electron mobility of $10^{-6}$ cm$^2$/Vs or higher. Note that any substance other than the above substances may be used for the electron-transport layer 207 as long as the electron-transport property is higher than the hole-transport property.

The electron-transport layer 207 is not limited to a single layer, and may be a stack of two or more layers containing any of the above substances.

The electron-injection layer 208 is a layer containing a substance having a high electron-injection property. For the electron-injection layer 208, an alkali metal, an alkaline earth metal, or a compound thereof, such as lithium fluoride (LiF), cesium fluoride (CsF), calcium fluoride (CaF$_2$), or lithium oxide (LiO$_x$), can be used. A rare earth metal compound like erbium fluoride (ErF$_3$) can also be used. Any of the above substances for forming the electron-transport layer 207 can also be used.

A composite material in which an organic compound and an electron donor (donor) are mixed may also be used for the electron-injection layer 208. Such a composite material is excellent in an electron-injection property and an electron-transport property because electrons are generated in the organic compound by the electron donor. In this case, the organic compound is preferably a material excellent in transporting the generated electrons. Specifically, for example, the above materials for forming the electron-transport layer 207 (e.g., a metal complex or a heteroaromatic compound) can be used. As the electron donor, a substance exhibiting an electron-donating property with respect to the organic compound may be used. Specifically, an alkali metal, an alkaline earth metal, and a rare earth metal are preferable, and lithium, cesium, magnesium, calcium, erbium, and ytterbium are exemplified. Further, an alkali metal oxide or an alkaline earth metal oxide is preferable, and for example, lithium oxide, calcium oxide, and barium oxide can be used. A Lewis base such as magnesium oxide can also be used. An organic compound such as tetrathiafulvalene (abbreviation: TTF) can also be used.

Note that each of the above hole-injection layer 204, hole-transport layer 205, light-emitting layer 206, electron-transport layer 207, and electron-injection layer 208 can be formed by, for example, an evaporation method (e.g., a vacuum evaporation method), an inkjet method, or a coating method.

Light emission obtained in the light-emitting layer 206 of the above-described light-emitting element is extracted to the outside through either the first electrode 201 or the second electrode 202 or both. Therefore, either the first electrode 201 or the second electrode 202 in this embodiment, or both, is an electrode having a light-transmitting property.

Note that the structure described in this embodiment can be used in combination with any of the structures described in the other embodiments, as appropriate.

Embodiment 3

In this embodiment, as one embodiment of the present invention, a light-emitting element (hereinafter referred to as tandem light-emitting element) in which a charge generation layer is provided between a plurality of EL layers is described.

Figure 4A:
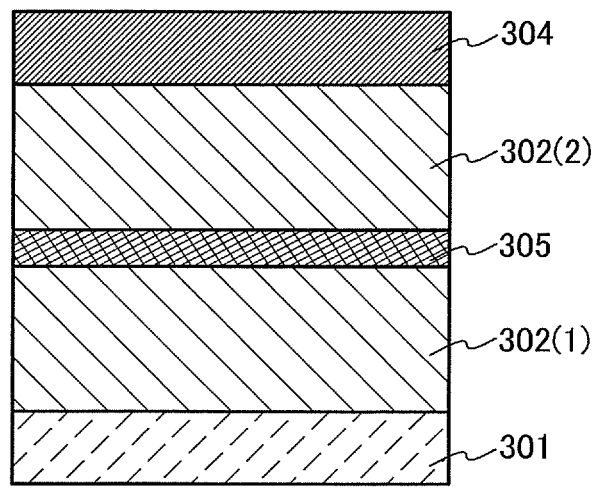
FIGS. 4A and 4B illustrate structures of light-emitting elements.

The light-emitting element described in this embodiment is a tandem light-emitting element including a plurality of EL layers (a first EL layer 302(1) and a second EL layer 302(2)) between a pair of electrodes (a first electrode 301 and a second electrode 304) as illustrated in FIG. 4A.

In this embodiment, the first electrode 301 functions as an anode, and the second electrode 304 functions as a cathode. Note that the first electrode 301 and the second electrode 304 can have structures similar to those described in Embodiment 2. In addition, all or any of the plurality of EL layers (the first EL layer 302(1) and the second EL layer 302(2)) may have structures similar to those described in Embodiment 2. In other words, the structures of the first EL layer 302(1) and the second EL layer 302(2) may be the same or different from each other and can be similar to those of the EL layers described in Embodiment 2.

A charge generation layer 305 is provided between the plurality of EL layers (the first EL layer 302(1) and the second EL layer 302(2)). The charge-generation layer 305 has a function of injecting electrons into one of the EL layers and injecting holes into the other of the EL layers when voltage is applied between the first electrode 301 and the second electrode 304. In this embodiment, when voltage is applied such that the potential of the first electrode 301 is higher than that of the second electrode 304, the charge-generation layer 305 injects electrons into the first EL layer 302(1) and injects holes into the second EL layer 302(2).

Note that for improving light extraction efficiency, the charge-generation layer 305 preferably has a property of transmitting visible light (specifically, the charge-generation layer 305 preferably has a visible light transmittance of 40% or higher). Further, the charge-generation layer 305 functions even when it has lower conductivity than the first electrode 301 or the second electrode 304.

The charge-generation layer 305 may have either a structure in which an electron acceptor (acceptor) is added to an organic compound having an excellent hole-transport property or a structure in which an electron donor (donor) is added to an organic compound having an excellent electron-transport property. Alternatively, both of these structures may be stacked.

In the case of the structure in which an electron acceptor is added to an organic compound having an excellent hole-transport property, as the organic compound having an excellent hole-transport property, for example, an aromatic amine compound such as NPB, TPD, TDATA, MTDATA, or BSPB can be used. The substances given here are mainly ones having a hole mobility of $10^{-6}$ cm$^2$/Vs or higher. However, any substance other than the above substances may be used as long the hole-transport property is higher than the electron-transport property.

Examples of the electron acceptor include a halogen compound such as 7,7,8,8-tetracyano-2,3,5,6-tetrafluoroquinodimethane (abbreviation: F4TCNQ) or chloranil; and a cyano compound such as pyrazino[2,3-f][1,10]phenanthroline-2,3-dicarbonitrile (abbreviation: PPDN) or dipyrazino[2,3-f:2',3'-h]quinoxaline-2,3,6,7,10,11-hexacarbonitrile (abbreviation: HAT-CN). Examples of the electron acceptor also include oxides of metals that belong to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is especially preferable because it is stable in the air, has a low hygroscopic property, and is easily handled.

In the case of the structure in which an electron donor is added to an organic compound having an excellent electron-transport property, as the organic compound having an excellent electron-transport property, for example, a metal complex having a quinoline skeleton or a benzoquinoline skeleton, such as Alq, Almq$_3$, BeBq$_2$, or BAlq, can be used. A metal complex having an oxazole-based ligand or a thiazole-based ligand, such as Zn(BOX)$_2$ or Zn(BTZ)$_2$, or the like can also be used. Other than metal complexes, PBD, OXD-7, TAZ, BPhen, BCP, or the like can be used. The substances given here are mainly ones having an electron mobility of $10^{-6}$ cm$^2$/Vs or higher. Note that substances other than the above substances may be used as long the electron-transport property is higher than the hole-transport property.

Further, as the electron donor, an alkali metal, an alkaline earth metal, a rare earth metal, a metal belonging to Group 2 or Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be also used as the electron donor.

Note that formation of the charge-generation layer 305 with use of any of the above materials can suppress an unnecessary increase in drive voltage caused by the stack of the EL layers.

Figure 4B:
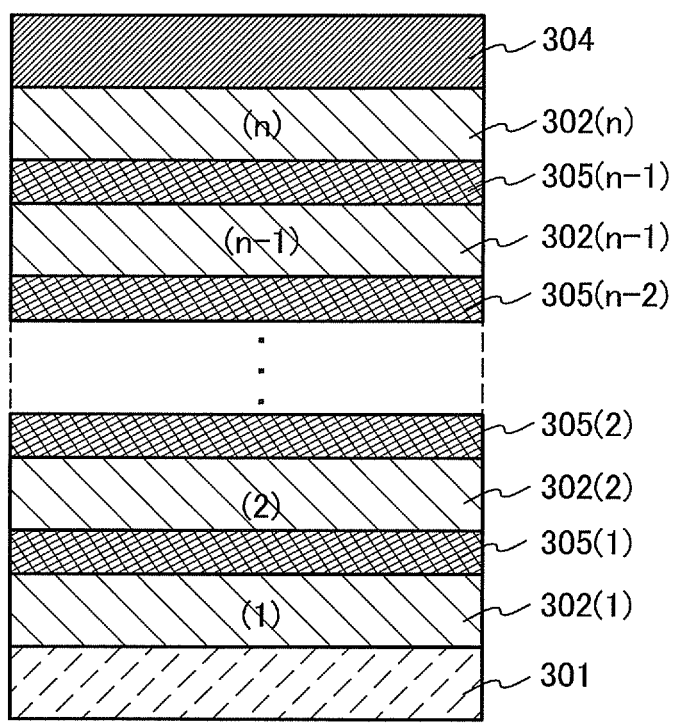

Although the light-emitting element having two EL layers is described in this embodiment, the present invention can be similarly applied to a light-emitting element in which n EL layers are stacked as illustrated in FIG. 4B. In the case where a plurality of EL layers is provided between a pair of electrodes as in the light-emitting element of this embodiment, by providing the charge-generation layer between the EL layers, the light-emitting element can emit light in a high luminance region while the current density is kept low. Since the current density can be kept low, the element can have a long lifetime. When the light-emitting element is applied to light-emitting devices, electronic apparatus, and lighting devices each having a large light-emitting area, voltage drop due to resistance of an electrode material can be reduced, thereby achieving homogeneous light emission in the whole of the light-emitting area.

By making emission colors of the EL layers different, light of a desired color can be obtained from the light-emitting element as a whole. For example, the emission colors of first and second EL layers are complementary in a light-emitting element having the two EL layers, whereby the light-emitting element can emit white light as a whole. Note that the term "complementary" means color relationship in which an achromatic color is obtained when colors are mixed. In other words, emission of white light can be obtained by mixture of light emitted from substances whose emission colors are complementary colors.

Further, the same applies to a light-emitting element having three EL layers. For example, the light-emitting element as a whole can emit white light when the emission color of the first EL layer is red, the emission color of the second EL layer is green, and the emission color of the third EL layer is blue.

As well as the structure described in this embodiment in which the EL layers are stacked with the charge generation layer provided therebetween, the light-emitting element may have a micro optical resonator (microcavity) structure which utilizes a light resonant effect by adjusting a distance between the electrodes (the first electrode 301 and the second electrode 304) to a desired value.

Note that the structure described in this embodiment can be used in combination with any of the structures described in the other embodiments, as appropriate.

Embodiment 4

In this embodiment, a light-emitting device including a light-emitting element of one embodiment of the present invention is described.

Note that any of the light-emitting elements described in the other embodiments can be used as the light-emitting element. Either a passive matrix light-emitting device or an active matrix light-emitting device may be used as the light-emitting device. An active matrix light-emitting device is described in this embodiment with reference to FIGS. 5A and 5B.

Figure 5A:
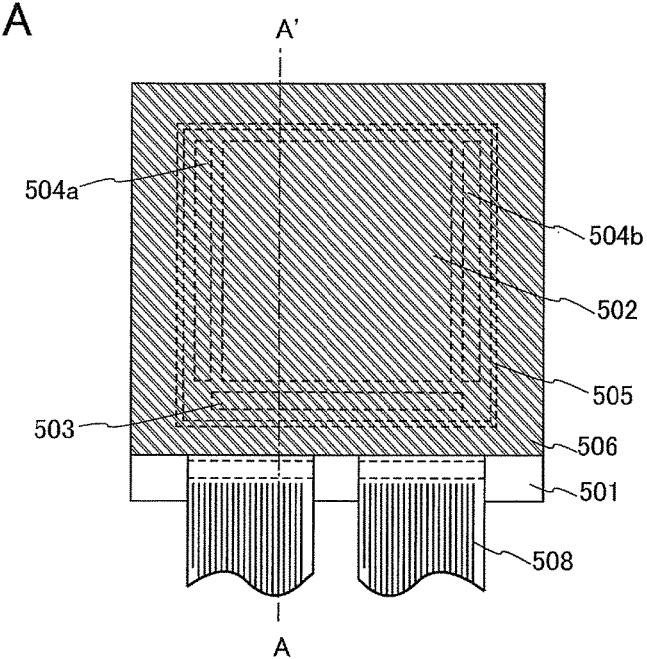
FIGS. 5A and 5B illustrate a light-emitting device.
Figure 5B:
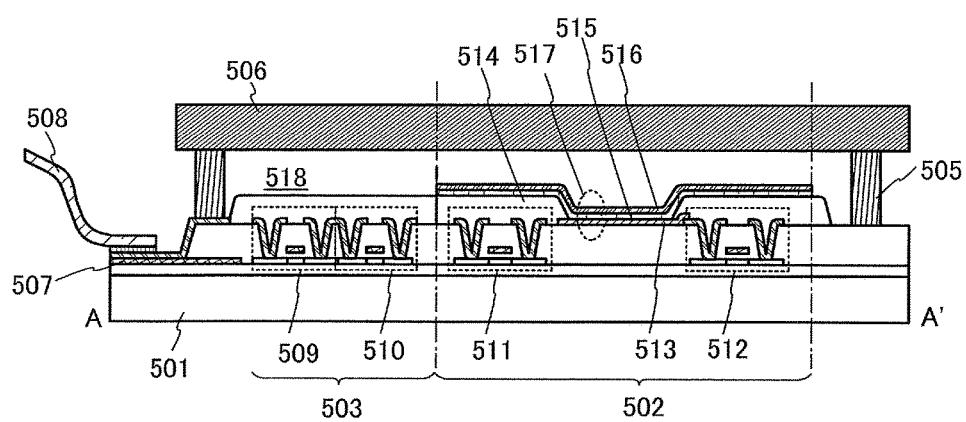

Note that FIG. 5A is a top view illustrating a light-emitting device and FIG. 5B is a cross-sectional view taken along the chain line A-A' in FIG. 5A. The active matrix light-emitting device of this embodiment includes a pixel portion 502 provided over an element substrate 501, a driver circuit portion (a source line driver circuit) 503, and driver circuit portions (gate line driver circuits) 504a and 504b.

The pixel portion 502, the driver circuit portion 503, and the driver circuit portions 504a and 504b are sealed between the element substrate 501 and a sealing substrate 506 with a sealant 505.

A lead wiring 507 is provided over the element substrate 501. The lead wiring 507 is provided for connecting an external input terminal through which a signal (e.g., a video signal, a clock signal, a start signal, and a reset signal) or a potential from the outside is transmitted to the driver circuit portion 503 and the driver circuit portions 504a and 504b. Here is shown an example in which a flexible printed circuit (FPC) 508 is provided as the external input terminal. Although the FPC is illustrated alone, this FPC may be provided with a printed wiring board (PWB). The light-emitting device in the present specification includes, in its category, not only the light-emitting device itself but also the light-emitting device provided with the FPC or the PWB.

Next, a cross-sectional structure is described with reference to FIG. 5B. The driver circuit portion and the pixel portion are formed over the element substrate 501; here are illustrated the driver circuit portion 503 which is the source line driver circuit and the pixel portion 502.

The driver circuit portion 503 is an example where a CMOS circuit is formed, which is a combination of an n-channel FET 509 and a p-channel FET 510. Note that a circuit included in the driver circuit portion may be formed using various CMOS circuits, PMOS circuits, or NMOS circuits, and any of a staggered type FET and a reverse-staggered type FET can be used. Further, the crystallinity of a semiconductor film used in the FET is not limited and can be amorphous or crystalline. Additionally, an oxide semiconductor may be used for the semiconductor film. Examples of the semiconductor material include element semiconductors such as silicon, germanium, tin, selenium, and tellurium; compound semiconductors such as GaAs, GaP, InSb, ZnS, and CdS; and oxide semiconductors such as $SnO_2$, ZnO, $Fe_2O_3$, $V_2O_5$, $TiO_2$, NiO, $Cr_2O_3$, $Cu_2O$, $MnO_2$, MnO, and InGaZnO (including the ones having different atomic ratios). Although this embodiment shows a driver integrated type in which the driver circuit is formed over the substrate, the driver circuit is not necessarily formed over the substrate, and may be formed outside the substrate.

The pixel portion 502 is formed of a plurality of pixels each of which includes a switching FET 511, a current control FET 512, and a first electrode (anode) 513 which is electrically connected to a wiring (a source electrode or a drain electrode) of the current control FET 512. Note that an insulator 514 is formed to cover end portions of the first electrode (anode) 513. In this embodiment, the insulator 514 is formed using a positive photosensitive acrylic resin.

The insulator 514 preferably has a curved surface with curvature at an upper end portion or a lower end portion thereof in order to obtain favorable coverage by a film which is to be stacked over the insulator 514. For example, in the case of using a positive photosensitive acrylic resin as a material of the insulator 514, the insulator 514 preferably has a curved surface with a curvature radius (0.2 μm to 3 μm) at the upper end portion. Note that the insulator 514 can be formed using either a negative photosensitive resin or a positive photosensitive resin. The material of the insulator 514 is not limited to an organic compound, and an inorganic compound such as silicon oxide or silicon oxynitride can also be used.

An EL layer 515 and a second electrode (cathode) 516 are stacked over the first electrode (anode) 513, so that a light-emitting element 517 is formed. Note that the EL layer 515 includes at least the light-emitting layer described in Embodiment 1. In the EL layer 515, a hole-injection layer, a hole-transport layer, an electron-transport layer, an electron-injection layer, a charge-generation layer, and the like can be provided as appropriate in addition to the light-emitting layer.

For the first electrode (anode) 513, the EL layer 515, and the second electrode (cathode) 516, the materials described in Embodiment 2 can be used. Although not illustrated, the second electrode (cathode) 516 is electrically connected to the FPC 508 which is an external input terminal.

Although the cross-sectional view of FIG. 5B illustrates only one light-emitting element 517, a plurality of light-emitting elements is arranged in a matrix in the pixel portion 502. Light-emitting elements which provide three kinds of light emission (R, G, and B) are selectively formed in the pixel portion 502, whereby a light-emitting device capable of full color display can be fabricated. Alternatively, a light-emitting device which is capable of full color display may be fabricated by a combination with color filters.

Further, the sealing substrate 506 is attached to the element substrate 501 with the sealant 505, whereby the light-emitting element 517 is provided in a space 518 surrounded by the element substrate 501, the sealing substrate 506, and the sealant 505. The space 518 may be filled with an inert gas (such as nitrogen or argon), or the sealant 505.

An epoxy-based resin or a glass frit is preferably used for the sealant 505. It is preferable that such a material allow permeation of moisture or oxygen as little as possible. As the sealing substrate 506, a glass substrate, a quartz substrate, or a plastic substrate formed of fiber-reinforced plastic (FRP), poly(vinyl fluoride) (PVF), a polyester, an acrylic resin, or the like can be used. In the case where glass frit is used as the sealant, the element substrate 501 and the sealing substrate 506 are preferably glass substrates.

As described above, an active matrix light-emitting device can be obtained.

Note that the structure described in this embodiment can be used in combination with any of the structures described in the other embodiments, as appropriate.

Embodiment 5

In this embodiment, examples of a variety of electronic devices which are completed using a light-emitting device are described with reference to FIGS. 6A to 6D and FIGS. 7A to 7C. The light-emitting device is fabricated using the light-emitting element of one embodiment of the present invention.

Examples of the electronic devices to which the light-emitting device is applied include television devices (also referred to as TV or television receivers), monitors for computers and the like, digital cameras, digital video cameras, digital photo frames, mobile phones (also referred to as cellular phones or mobile phone devices), portable game machines, portable information terminals, audio playback devices, and large-sized game machines such as pin-ball machines. Specific examples of the electronic devices are illustrated in FIGS. 6A to 6D.

Figure 6A:
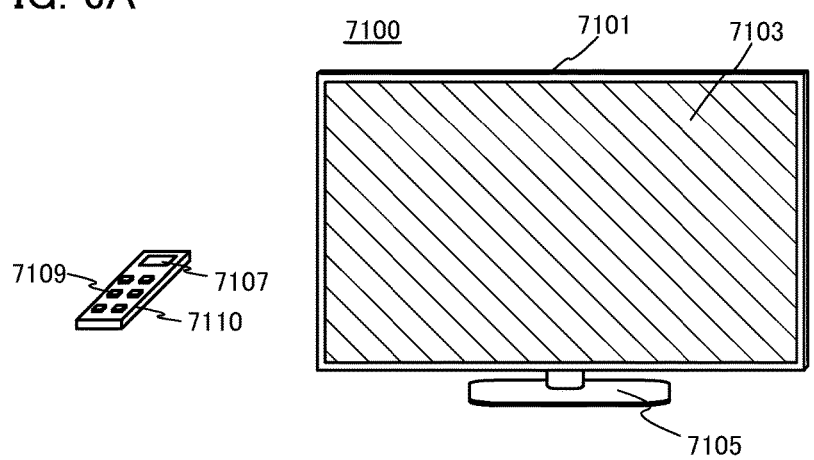
FIGS. 6A to 6D illustrate electronic devices.

FIG. 6A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 6B:
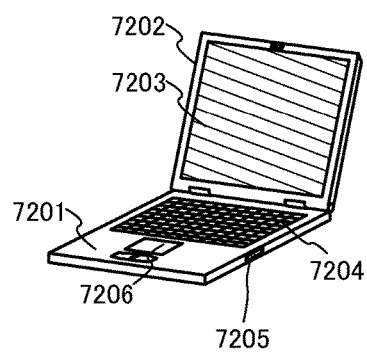

FIG. 6B illustrates a computer including a main body 7201, a housing 7202, a display portion 7203, a keyboard 7204, an external connecting port 7205, a pointing device 7206, and the like. This computer is manufactured by using the light-emitting device of one embodiment of the present invention for the display portion 7203.

Figure 6C:
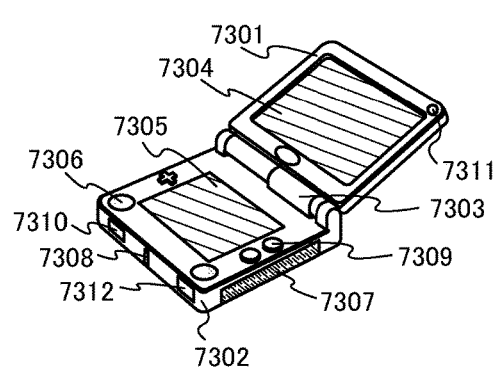

FIG. 6C illustrates a portable game machine including two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 6C includes a speaker portion 7306, a recording medium insertion portion 7307, an LED lamp 7308, an input means (an operation key 7309, a connection terminal 7310, and a microphone 7312), a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and the like. It is needless to say that the structure of the portable game machine is not limited to the above as long as a light-emitting device is used for at least either the display portion 7304 or the display portion 7305, or both, and may include other accessories as appropriate. The portable game machine illustrated in FIG. 6C has a function of reading out a program or data stored in a storage medium to display it on the display portion, and a function of sharing information with another portable game machine by wireless communication. The portable game machine illustrated in FIG. 6C can have a variety of functions without limitation to the above.

Figure 6D:
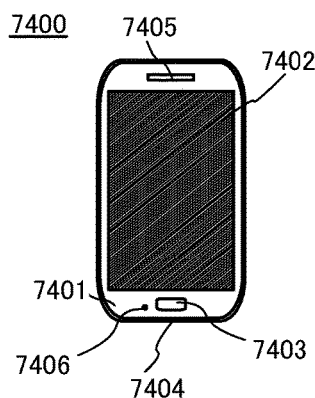

FIG. 6D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using a light-emitting device for the display portion 7402.

When the display portion 7402 of the mobile phone 7400 illustrated in FIG. 6D is touched with a finger or the like, data can be input into the mobile phone 7400. Further, operations such as making a call and composing an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In this case, it is preferable to display a keyboard or number buttons on almost the entire screen of the display portion 7402.

When a detection device including a sensor (e.g., a gyroscope or an acceleration sensor) is provided inside the mobile phone 7400, display on the screen of the display portion 7402 can be automatically changed by determining the orientation of the mobile phone 7400 (whether the mobile phone is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when it is determined that input by touching the display portion 7402 is not performed within a specified period on the basis of a signal detected by an optical sensor in the display portion 7402, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a sensing light source which emits a near-infrared light in the display portion, an image of a finger vein, a palm vein, or the like can be taken.

Figure 7A:
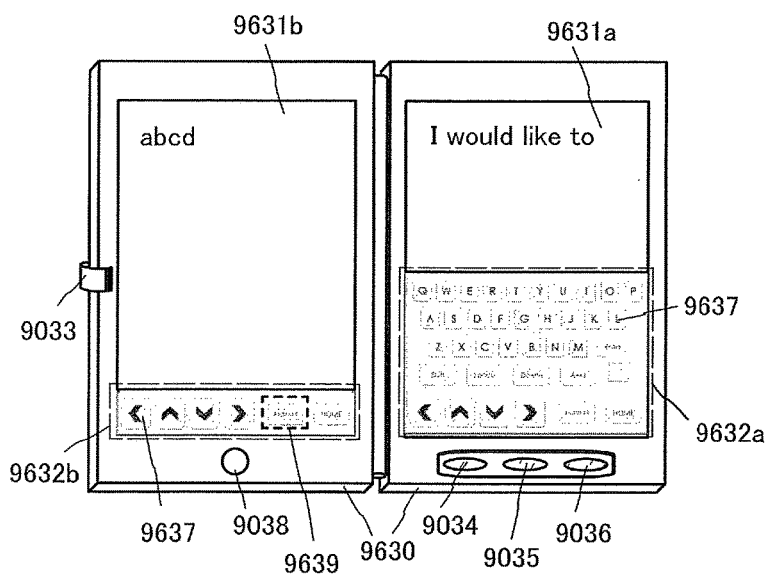
FIGS. 7A to 7C illustrate an electronic device.
Figure 7B:
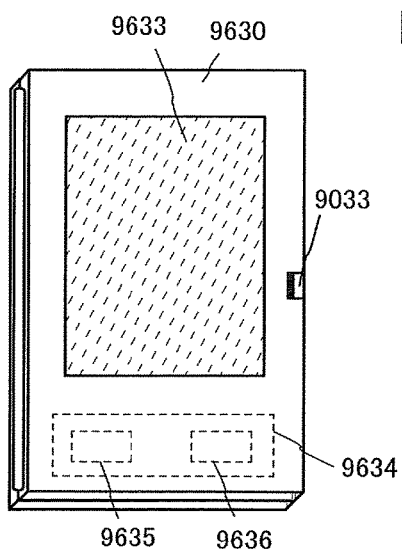

FIGS. 7A and 7B illustrate a foldable tablet terminal. In FIG. 7A, a state that the tablet terminal is opened is illustrated. The tablet terminal includes a housing 9630, a display portion 9631*a*, a display portion 9631*b*, a display mode switch 9034, a power switch 9035, a power saver switch 9036, a clasp 9033, and an operation switch 9038. The tablet terminal is manufactured using the light-emitting device for one or both of the display portions 9631*a* and 9631*b*.

Part of the display portion 9631*a* can be a touch panel region 9632*a*, and data can be input by touching operation keys 9637 that are displayed. Note that FIG. 7A shows, as an example, that half of the area of the display portion 9631*a* has only a display function and the other half of the area has a touch panel function. However, the structure of the display portion 9631*a* is not limited to this mode, and all the area of the display portion 9631*a* may have a touch panel function. For example, all the area of the display portion 9631*a* can display keyboard buttons and serve as a touch panel while the display portion 9631*b* can be used as a display screen.

Like the display portion 9631*a*, part of the display portion 9631*b* can be a touch panel region 9632*b*. When a finger, a stylus, or the like touches the place where a button 9639 for switching to keyboard display is displayed in the touch panel, keyboard buttons can be displayed on the display portion 9631*b*.

Furthermore, touch input can be performed concurrently on the touch panel regions 9632*a* and 9632*b*.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet terminal is in use, which is measured with an optical sensor incorporated in the tablet terminal. The tablet terminal may include another detection device such as a sensor (e.g., a gyroscope or an acceleration sensor) in addition to the optical sensor.

Although FIG. 7A shows the example where the display area of the display portion 9631a is the same as that of the display portion 9631b, one embodiment of the present invention is not limited to this example. They may differ in size and/or image quality. For example, one of them may be a display panel that can display higher-definition images than the other.

FIG. 7B illustrates the tablet terminal which is closed. The tablet terminal includes the housing 9630, a solar battery 9633, a charge/discharge control circuit 9634, a battery 9635, and a DC to DC converter 9636.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

The tablet terminal illustrated in FIGS. 7A and 7B can also have a function of displaying various kinds of data, such as a calendar, a date, or the time, on the display portion as a still image, a moving image, and a text image, a function of displaying, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630 and thus the battery 9635 can be charged efficiently. When a lithium ion battery is used as the battery 9635, there is an advantage of downsizing or the like.

Figure 7C:
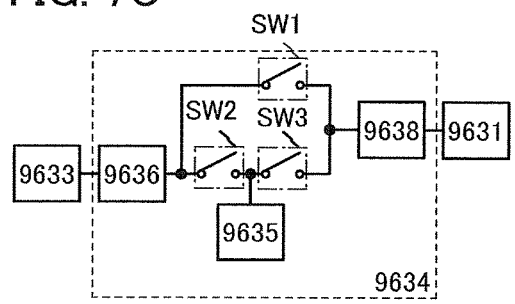

The structure and operation of the charge/discharge control circuit 9634 illustrated in FIG. 7B are described with reference to a block diagram in FIG. 7C. FIG. 7C illustrates the solar battery 9633, the battery 9635, the DC to DC converter 9636, a converter 9638, switches SW1 to SW3, and the display portion 9631. The battery 9635, the DC to DC converter 9636, the converter 9638, and the switches SW1 to SW3 correspond to those in the charge/discharge control circuit 9634 illustrated in FIG. 7B.

An example of the operation performed when power is generated by the solar battery 9633 using external light is described. The voltage of power generated by the solar battery 9633 is raised or lowered by the DC to DC converter 9636 so as to be a voltage for charging the battery 9635. Then, when power from the solar battery 9633 is used for the operation of the display portion 9631, the switch SW1 is turned on and the voltage of the power is raised or lowered by the converter 9638 so as to be a voltage needed for the display portion 9631. When images are not displayed on the display portion 9631, the switch SW1 is turned off and the switch SW2 is turned on so that the battery 9635 is charged.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

It is needless to say that an embodiment of the present invention is not limited to the electronic device illustrated in FIGS. 7A to 7C as long as the display portion described in the above embodiment is included.

As described above, the electronic devices can be obtained by application of the light-emitting device of one embodiment of the present invention. The light-emitting device has an extremely wide application range, and can be applied to electronic devices in a variety of fields.

Note that the structure described in this embodiment can be used in combination with any of the structures described in the other embodiments, as appropriate.

Embodiment 6

In this embodiment, examples of lighting devices which are completed using a light-emitting device are described with reference to FIG. 8. The light-emitting device is fabricated using a light-emitting element of one embodiment of the present invention.

Figure 8:
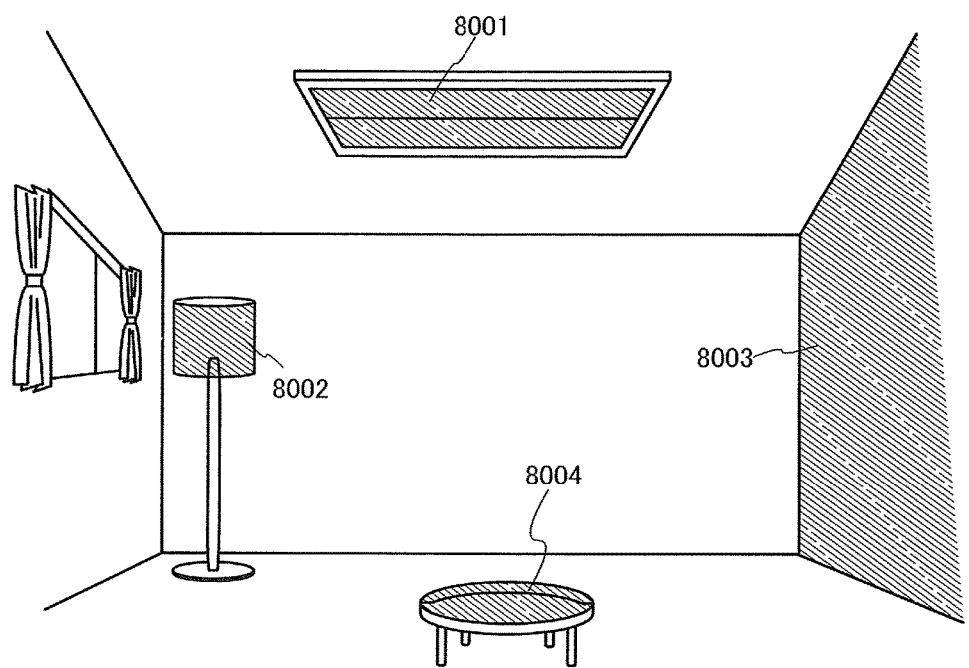
FIG. 8 illustrates lighting devices.

FIG. 8 illustrates an example in which the light-emitting device is used as an indoor lighting device 8001. Since the light-emitting device can have a larger area, it can be used for a lighting device having a large area. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003.

Moreover, when the light-emitting device is used at a surface of a table, a lighting device 8004 which has a function as a table can be obtained. When the light-emitting device is used as part of other furniture, a lighting device which has a function as the furniture can be obtained.

As described above, a variety of lighting devices to which the light-emitting device is applied can be obtained. Note that such lighting devices are also embodiments of the present invention.

Note that the structure described in this embodiment can be used in combination with any of the structures described in the other embodiments, as appropriate.

Example 1

Figure 9:
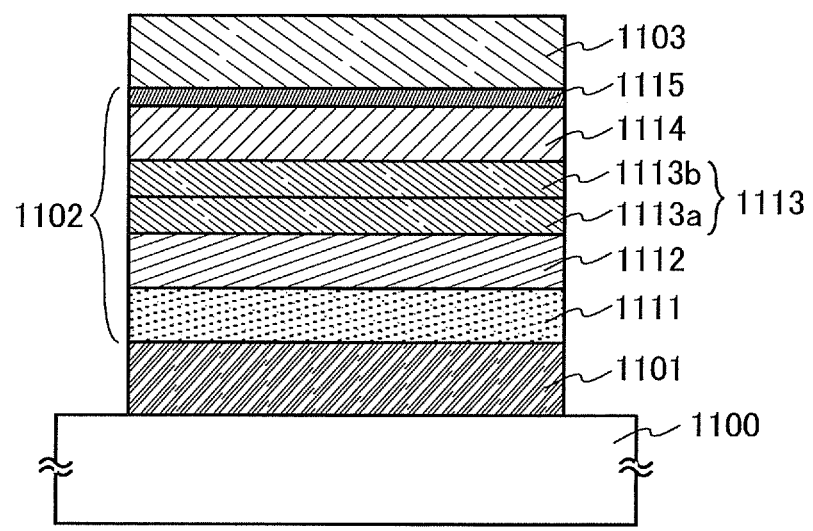
FIG. 9 illustrates a structure of a light-emitting element.

In this example, a light-emitting element 1 (Element 1) and a comparative light-emitting element 2 (Reference Element 2) which are embodiments of the present invention are described with reference to FIG. 9. Chemical formulae of materials used in this example are shown below.

-continued
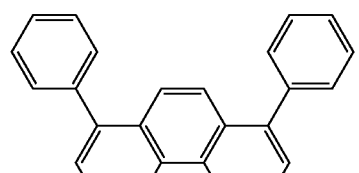
Bphen
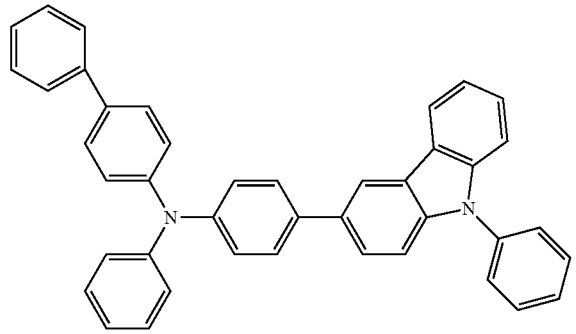
PCBA1BP
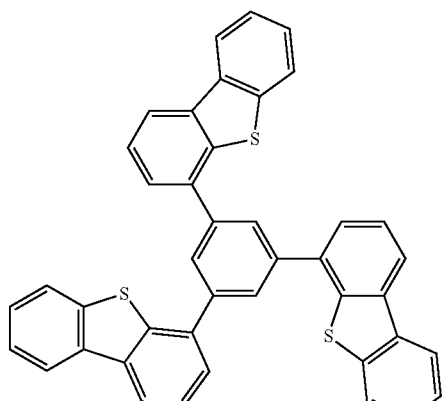
DBT3P-II
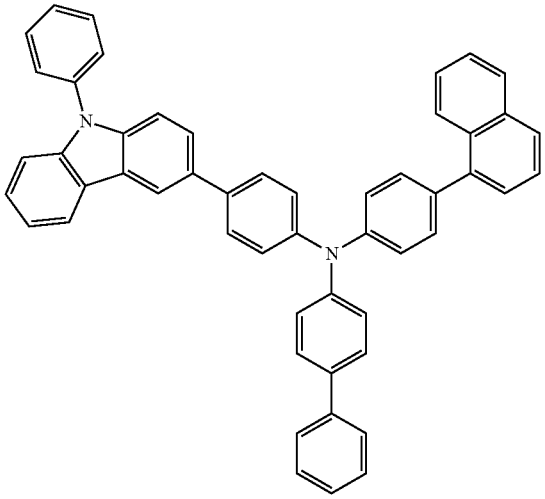
PCBBiNB
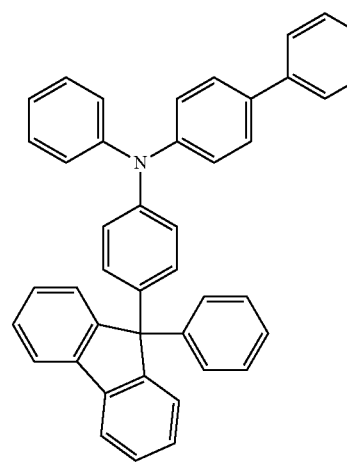
BPAFLP
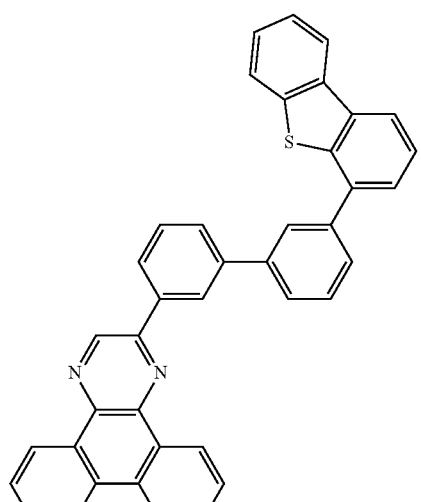
2mDBTBPDB-II
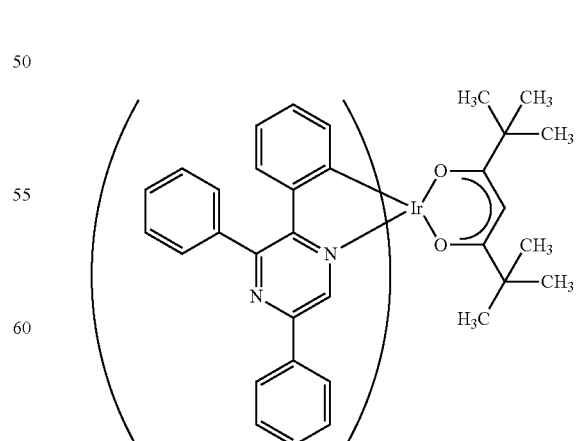
[Ir(tppr)$_2$(dpm)]

-continued

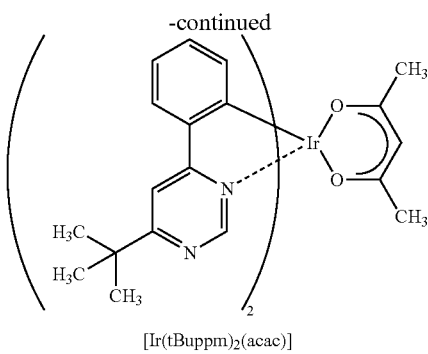

[Ir(tBuppm)₂(acac)]

<<Fabrication of Light-Emitting Element 1 and Comparative Light-Emitting Element 2>>

First, a film of indium oxide-tin oxide containing silicon oxide (ITSO) was formed over a glass substrate 1100 by a sputtering method, so that a first electrode 1101 functioning as an anode was formed. The thickness was 110 nm and the electrode area was 2 mm×2 mm.

Next, as pretreatment for forming the light-emitting element over the substrate 1100, the surface of the substrate was washed with water, baked at 200° C. for 1 hour, and subjected to UV ozone treatment for 370 seconds.

After that, the substrate 1100 was transferred into a vacuum evaporation apparatus in which the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was formed was fixed to a substrate holder provided in the vacuum evaporation apparatus so that the surface provided with the first electrode 1101 faced downward. In this example, a case is described in which a hole-injection layer 1111, a hole-transport layer 1112, a light-emitting layer 1113, an electron-transport layer 1114, and an electron-injection layer 1115 which are included in an EL layer 1102 are sequentially formed by a vacuum evaporation method.

After reducing the pressure in the vacuum evaporation apparatus to $10^{-4}$ Pa, 1,3,5-tri(dibenzothiophen-4-yl)benzene (abbreviation: DBT3P-II) and molybdenum(VI) oxide were co-evaporated with a mass ratio of DBT3P-II to molybdenum oxide being 2:1, whereby the hole-injection layer 1111 was formed over the first electrode 1101. The thickness was 33 nm. Note that a co-evaporation method is an evaporation method in which a plurality of different substances is concurrently vaporized from respective different evaporation sources.

Then, 4-phenyl-4'-(9-phenylfluoren-9-yl)triphenylamine (abbreviation: BPAFLP) was evaporated to a thickness of 20 nm, so that the hole-transport layer 1112 was formed.

Next, the light-emitting layer 1113 (a first light-emitting layer 1113a and a second light-emitting layer 1113b) was formed over the hole-transport layer 1112. For the light-emitting element 1, the light-emitting layer 1113 having a stacked structure was formed as follows: 2-[3'-(dibenzothiophen-4-yl)biphenyl-3-yl]dibenzo[f,h]quinoxaline (abbreviation: 2mDBTBPDBq-II), 4-(1-naphthyl)-4'-phenyl-4"-(9-phenyl-9H-carbazol-3-yl)triphenylamine (abbreviation: PCBBiNB), and (acetylacetonato)bis(6-tert-butyl-4-phenylpyrimidinato)iridium(III) (abbreviation: [Ir(tBuppm)₂(acac)]) were co-evaporated to a thickness of 20 nm with a mass ratio of 2mDBTBPDBq-II to PCBBiNB and [Ir(tBuppm)₂(acac)] being 0.8:0.2:0.06, whereby the first light-emitting layer 1113a was formed; co-evaporation was further performed using bis(2,3,5-triphenylpyrazinato)(dipivaloylmethanato)iridium(III) (abbreviation: [Ir(tppr)₂(dpm)]) instead of [Ir(tBuppm)₂(acac)] to a thickness of 20 nm with a mass ratio of 2mDBTBPDBq-II to PCBBiNB and [Ir(tppr)₂(dpm)] being 0.9:0.1:0.06, whereby the second light-emitting layer 1113b was formed.

For the comparative light-emitting element 2, 2mDBTBPDBq-II, 4-phenyl-4'-(9-phenyl-9H-carbazol-3-yl)triphenylamine (abbreviation: PCBA1BP), and [Ir(tBuppm)₂(acac)] were co-evaporated to a thickness of 20 nm with a mass ratio of 2mDBTBPDBq-II to PCBA1BP and [Ir(tBuppm)₂(acac)] being 0.8:0.2:0.06, and then further co-evaporated to a thickness of 20 nm with a mass ratio of 2mDBTBPDBq-II to PCBA1BP and [Ir(tppr)₂(dpm)] being 0.9:0.1:0.06; thus, the light-emitting layer 1113 was formed.

Then, 2mDBTBPDBq-II was evaporated to a thickness of 15 nm over the light-emitting layer 1113 and bathophenanthroline (abbreviation: Bphen) was evaporated to a thickness of 15 nm, whereby the electron-transport layer 1114 having a stacked structure was formed. Furthermore, lithium fluoride was evaporated to a thickness of 1 nm over the electron-transport layer 1114, whereby the electron-injection layer 1115 was formed.

Finally, aluminum was evaporated to a thickness of 200 nm over the electron-injection layer 1115 to form a second electrode 1103 serving as a cathode; thus, the light-emitting element 1 and the comparative light-emitting element 2 were obtained. Note that, in the above evaporation process, evaporation was all performed by a resistance heating method.

In the above-described manner, the light-emitting element 1 and the comparative light-emitting element 2 were obtained. Table 1 shows element structures of the light-emitting element 1 (Element 1) and the comparative light-emitting element 2 (Reference Element 2).

TABLE 1

| | First electrode | HIL[a] | HTL[b] | Light-emitting layer | | ETL[c] | EIL[d] | Second electrode |
|---|---|---|---|---|---|---|---|---|
| | | | | 1st | 2nd | | | |
| Element 1 | ITSO (110 nm) | DBT3P-II:MoOx (2:1 33 nm) | BPAFLP (20 nm) | [e] | [f] | 2mDBTBPDBq-II (15 nm) | Bphen (15 nm) | LiF (1 nm) | Al (200 nm) |
| Reference Element 2 | | | | [g] | [h] | | | | |

[a]Hole-injection layer.
[b]Hole-transport layer.
[c]Electron-transport layer.
[d]Electron-injection layer.
[e]2mDBTBPDBq-II:PCBBiNB:[Ir(tBuppm)₂(acac)] (0.8:0.2:0.06 20 nm).
[f]2mDBTBPDBq-II:PCBBiNB:[Ir(tppr)₂(dpm)] (0.9:0.1:0.06 20 nm)
[g]2mDBTBPDBq-II:PCBA1BP:[Ir(tBuppm)₂(acac)] (0.8:0.2:0.06 20 nm)
[h]2mDBTBPDBq-II:PCBA1BP:Ir(tppr)₂(dpm)] (0.9:0.1:0.06 20 nm)

The fabricated light-emitting element 1 and comparative light-emitting element 2 were sealed in a glove box containing a nitrogen atmosphere so as not to be exposed to the air (specifically, a sealant was applied onto outer edges of the elements and heat treatment was performed at 80° C. for 1 hour at the time of sealing).

<<Operation Characteristics of Light-Emitting Element 1 and Comparative Light-Emitting Element 2>>

Operation characteristics of the fabricated light-emitting element 1 and comparative light-emitting element 2 were measured. Note that the measurement was carried out at room temperature (in an atmosphere kept at 25° C.).

Figure 10:
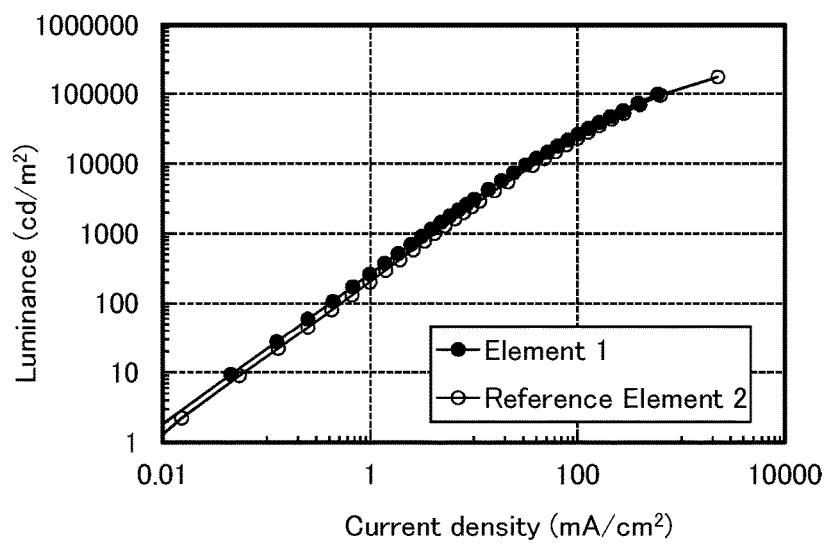
FIG. 10 shows luminance versus current density characteristics of a light-emitting element 1 (also referred to as Element 1) and a comparative light-emitting element 2 (also referred to as Reference Element 2).
Figure 11:
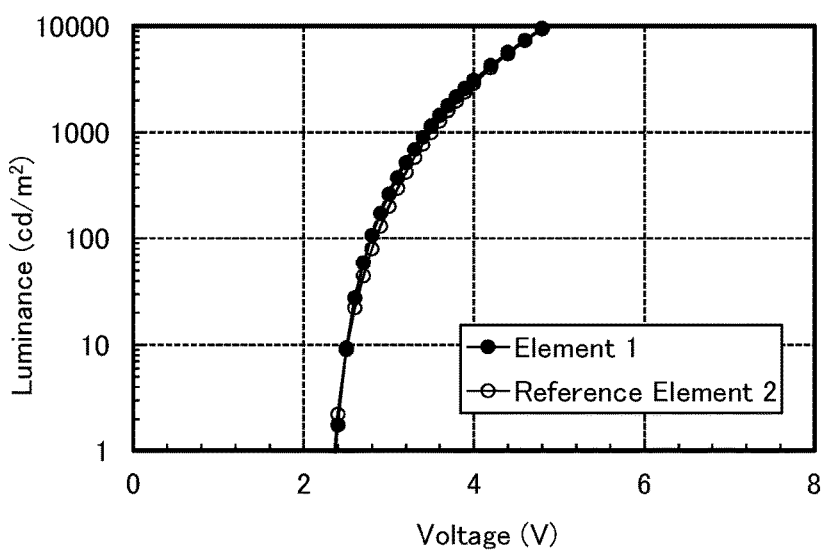
FIG. 11 shows luminance versus voltage characteristics of the light-emitting element 1 and the comparative light-emitting element 2.
Figure 12:
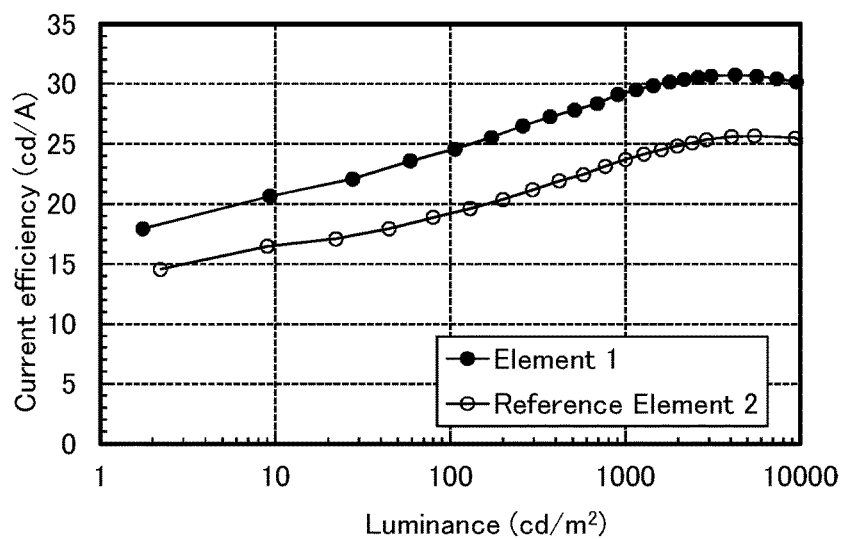
FIG. 12 shows current efficiency versus luminance characteristics of the light-emitting element 1 and the comparative light-emitting element 2.
Figure 13:
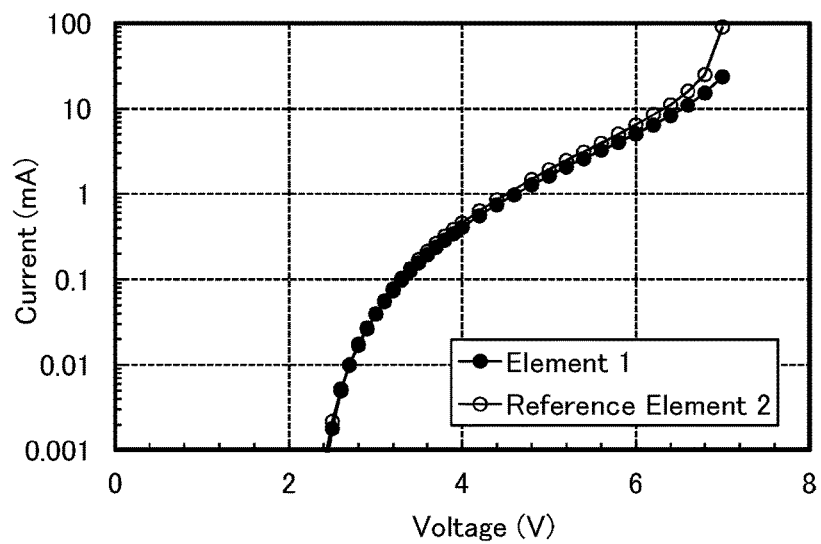
FIG. 13 shows current versus voltage characteristics of the light-emitting element 1 and the comparative light-emitting element 2.

FIG. 10 shows luminance versus current density characteristics of the light-emitting element 1 and the comparative light-emitting element 2. In FIG. 10, the vertical axis represents luminance ($cd/m^2$) and the horizontal axis represents current density ($mA/cm^2$). FIG. 11 shows luminance versus voltage characteristics of the light-emitting element 1 and the comparative light-emitting element 2. In FIG. 11, the vertical axis represents luminance ($cd/m^2$) and the horizontal axis represents voltage (V). FIG. 12 shows current efficiency versus luminance characteristics of the light-emitting element 1 and the comparative light-emitting element 2. In FIG. 12, the vertical axis represents current efficiency (cd/A) and the horizontal axis represents luminance ($cd/m^2$). FIG. 13 shows current versus voltage characteristics of the light-emitting element 1 and the comparative light-emitting element 2. In FIG. 13, the vertical axis represents current (mA) and the horizontal axis represents voltage (V).

The results of FIG. 10, FIG. 11, FIG. 12, and FIG. 13 reveal that the light-emitting element 1 of one embodiment of the present invention and the comparative light-emitting element 2 show favorable characteristics (see Table 2 given below) and no large difference was observed therebetween although in a light-emitting layer of the light-emitting element 1, PCBBiNB whose T1 level is lower than that of [Ir(tBuppm)$_2$(acac)] is used as a host material and [Ir(tBuppm)$_2$(acac)] is used as a guest material while in a light-emitting layer of the comparative light-emitting element 2, PCBA1BP whose T1 level is higher than that of [Ir(tBuppm)$_2$(acac)] is used as a host material.

Table 2 shows initial performance of main characteristics of the light-emitting element 1 and the comparative light-emitting element 2 at a luminance of about 1000 $cd/m^2$.

from emission of [Ir(tBuppm)$_2$(acac)] and [Ir(tppr)$_2$(dpm)], but the emission intensity at 546 nm is lower than that of the light-emitting element 1. This is probably because light-emitting regions differ depending on materials used for the light-emitting elements.

Figure 15:
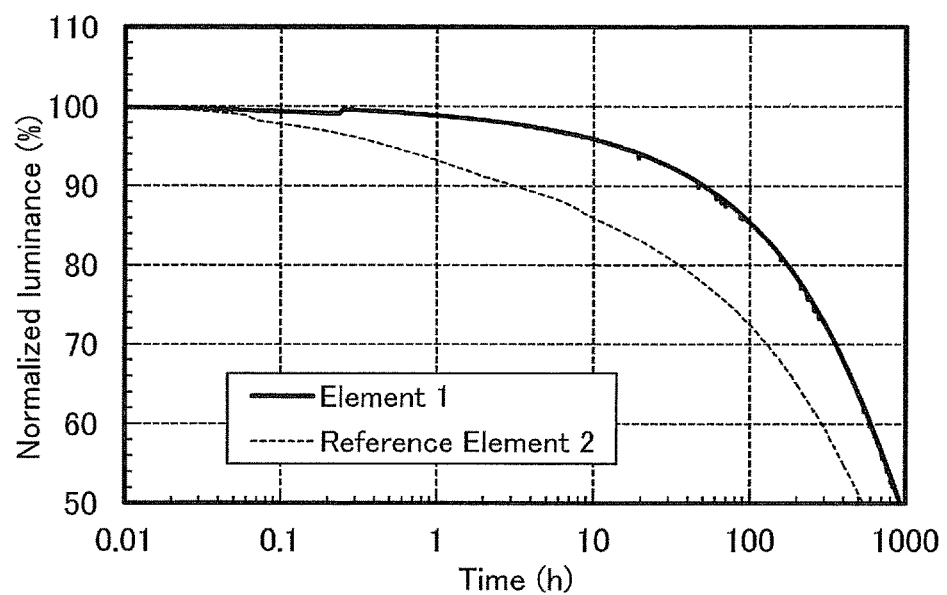
FIG. 15 shows reliability of each of the light-emitting element 1 and the comparative light-emitting element 2.

Next, reliability tests of the light-emitting element 1 and the comparative light-emitting element 2 were conducted. FIG. 15 shows results of the reliability tests. In FIG. 15, the vertical axis represents normalized luminance (%) with an initial luminance of 100%, and the horizontal axis represents driving time (h) of the elements. Note that in the reliability tests, the light-emitting element 1 and the comparative light-emitting element 2 were driven under the conditions that the initial luminance was 5000 $cd/m^2$ and the current density was constant. As a result, the luminance of the light-emitting element 1 after 100-hour driving was about 85% of the initial luminance; thus, the light-emitting element 1 kept higher luminance than that of the comparative light-emitting element 2.

The above reliability tests show that the light-emitting element 1 of one embodiment of the present invention has high reliability and a long lifetime.

Example 2

In this example, several samples in which an organic film (thickness: 50 nm) was provided between quartz substrates were fabricated, and the lifetime ($\tau_1$, $\tau_2$) [μsec] of each sample was measured. The organic film was made using 2mDBTBPDBq-II (host material), PCBBiNB or PCBA1BP (host material), and [Ir(tBuppm)$_2$(acac)] (guest material), which were contained in the light-emitting layer of the light-emitting element 1 or the comparative light-emitting element 2 in Example 1. The composition or mass ratio of these materials was made to be different among the samples.

The mass ratio in the organic film was such that 2mDBTBPDBq-II:PCBBiNB (or PCBA1BP):[Ir(tBuppm)$_2$(acac)]=1−X:X:0.06. Table 3 shows the components and the emission lifetimes of the samples.

TABLE 2

| | Voltage (V) | Current (mA) | Current density ($mA/cm^2$) | Chromaticity (x, y) | Luminance ($cd/m^2$) | Current efficiency (cd/A) | Power efficiency (lm/W) | External quantum efficiency (%) |
|---|---|---|---|---|---|---|---|---|
| Element 1 | 3.4 | 0.12 | 3.1 | (0.49, 0.50) | 900 | 29 | 27 | 14 |
| Reference Element 2 | 3.5 | 0.17 | 4.2 | (0.52, 0.47) | 1000 | 24 | 21 | 14 |

The above results in Table 2 also show that each of the light-emitting element 1 and the comparative light-emitting element 2 fabricated in this example has high quantum efficiency.

Figure 14:
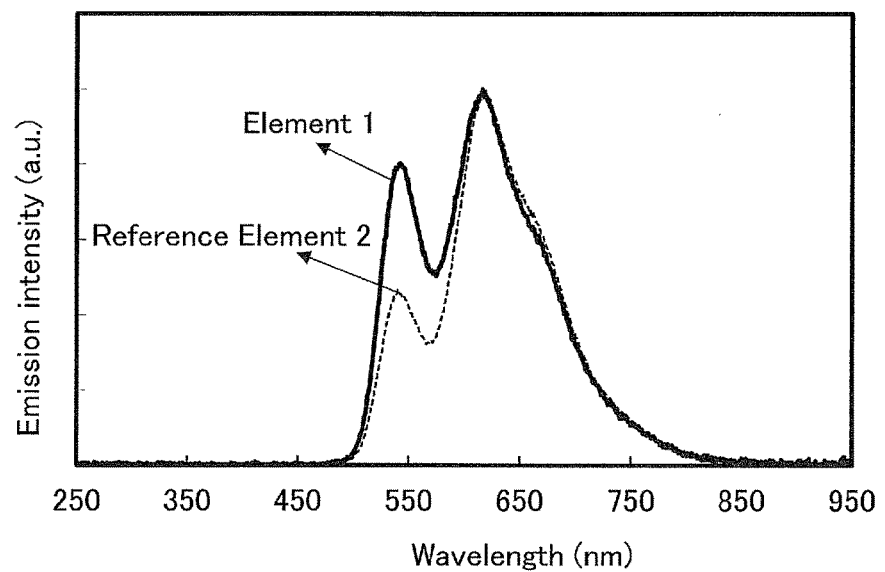
FIG. 14 shows an emission spectrum of each of the light-emitting element 1 and the comparative light-emitting element 2.

FIG. 14 shows emission spectra of the light-emitting element 1 and the comparative light-emitting element 2 which were obtained when a current of 0.1 mA flowed in these light-emitting elements. As shown in FIG. 14, the emission spectrum of the light-emitting element 1 has peaks at 546 nm and 620 nm, which are found to be derived from emission of [Ir(tBuppm)$_2$(acac)] and [Ir(tppr)$_2$(dpm)], respectively, contained in the light-emitting layer 1113. The comparative light-emitting element 2 also has peaks derived

TABLE 3

| Sample | Host material | X | $\tau_1$ [a] [μsec] | $\tau_2$ [b] [μsec] | Emission lifetime [c] [μsec] |
|---|---|---|---|---|---|
| 1 | PCBBiNB | 0 | 1.15 | — | 5.3 |
| 2 | PCBBiNB | 0.2 | 1.01 | 1.81 | 6.4 |
| 3 | PCBBiNB | 0.5 | 0.96 | 2.21 | 7.7 |
| 4 | PCBBiNB | 1 | 1.00 | 3.42 | 11.1 |
| 5 | PCBA1BP | 0.5 | 1.20 | — | 5.4 |

[a] Lifetime of the first decay component.
[b] Lifetime of the second decay component.
[c] Time required to decay to 1/100 of the initial value.

Figure 16:
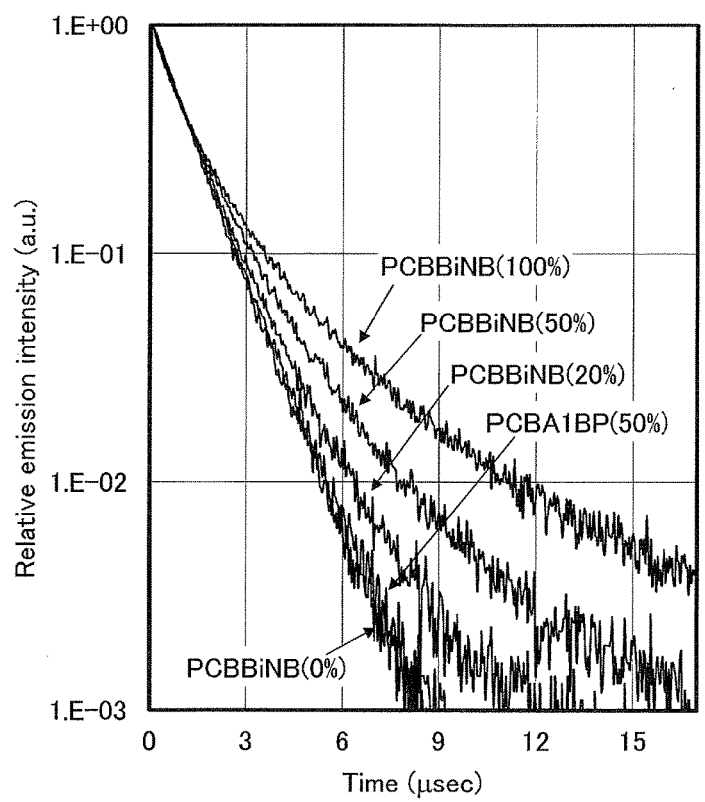
FIG. 16 shows the emission decay curves of light-emitting elements.

The measurement was performed using a streak camera (C4334 manufactured by Hamamatsu Photonics K.K.) with an $N_2$ gas laser (MSG 800 manufactured by Laser Technik Berlin, λ=337 nm, pulse width<500 ps, repetition rate=10 Hz). The hole size was set to 100 μm, and the measurement time was set in a range of 0 μsec to 20 μsec. FIG. 16 shows the measurement results. Here, $\tau_1$ and $\tau_2$ each are the lifetimes of the decay components which are divided according to Formula 1. From Table 3, it can be concluded that Samples 2 to 4 give a multicomponent (two components) decay curve.

The analysis of the data shown in FIG. 16 indicates that, in the case of Sample 5 where PCBA1BP whose T1 level is higher than that of [Ir(tBuppm)$_2$(acac)] serving as a guest material is used as a host material (PCBA1BP: 50%), only a single decay component is observed. On the other hand, in the case of Sample 2 (PCBBiNB: 20%), Sample 3 (PCBBiNB: 50%), and Sample 4 (PCBBiNB: 100%) where PCBBiNB whose T1 level is lower than that of [Ir(tBuppm)$_2$(acac)] serving as a guest material is used as a host material, two decay components (a first decay component and a second decay component) are observed and their lifetimes, which are the time required for the initial emission intensity to decay to 1/100 of the initial values, are less than or equal to 15 μsec. Furthermore, it is found that the emission lifetime (τ1) of the first decay component in each of Samples 2 to 4 is shorter than that in Sample 5; the emission lifetime (τ2) of the second decay component in Sample 4 having the highest proportion of PCBBiNB is the longest among Samples 2 to 4. The second component is considered to be contributed by the emission process via the energy transfer from the host material to the guest material.

Thus, the features of the light-emitting element of one embodiment of the present invention are that a light-emitting layer including a guest material and a host material having a T1 level lower than that of the guest material is included and that the emission from the light-emitting layer shows a multicomponent decay curve as shown in FIG. 16.

EXPLANATION OF REFERENCE

11: host material, 12: first guest material, 101: anode, 102: cathode, 103: EL layer, 104: light-emitting layer, 105: first organic compound (serving as a host material), 106: second organic compound (serving as a first guest material), 107: third organic compound (serving as a second guest material), 201: first electrode, 202: second electrode, 203: EL layer, 204: hole-injection layer, 205: hole-transport layer, 206: light-emitting layer, 207: electron-transport layer, 208: electron-injection layer, 209: first organic compound (serving as a host material), 210: second organic compound (serving as a first guest material), 211: third organic compound (serving as a second guest material), 301: first electrode, 302(1): first EL layer, 302(2): second EL layer, 304: second electrode, 305: charge-generation layer, 305(1): first charge-generation layer, 305(2): second charge-generation layer, 501: element substrate, 502: pixel portion, 503: driver circuit portion (source line driver circuit), 504a, 504b: driver circuit portion (gate line driver circuit), 505: sealant, 506: sealing substrate, 507: wiring, 508: FPC (flexible printed circuit), 509: n-channel FET, 510: p-channel FET, 511: switching FET, 512: current control FET, 513: first electrode (anode), 514: insulator, 515: EL layer, 516: second electrode (cathode), 517: light-emitting element, 518: element layer, 1100: substrate, 1101: first electrode, 1102: EL layer, 1103: second electrode, 1111: hole-injection layer, 1112: hole-transport layer, 1113: light-emitting layer, 1113a: first light-emitting layer, 1113b: second light-emitting layer, 1114: electron-transport layer, 1115: space, 7100: television device, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7312: microphone, 7400: mobile phone device, 7401: housing, 7402: display portion, 7403: operation button, 7404: external connection port, 7405: speaker, 7406: microphone, 8001: lighting device, 8002: lighting device, 8003: lighting device, 8004: lighting device, 9033: clasp, 9034: display mode switch, 9035: power supply switch, 9036: power saver switch, 9038: operation switch, 9630: housing, 9631: display portion, 9631a: display portion, 9631b: display portion, 9632a: touch panel region, 9632b: touch panel region, 9633: solar cell, 9634: charge/discharge control circuit, 9635: battery, 9636: DC-DC converter, 9637: operation key, 9638: converter, 9639: button This application is based on Japanese Patent Application serial no. 2013-063634 filed with Japan Patent Office on Mar. 26, 2013, the entire contents of which are hereby incorporated by reference.

What is claimed is:
1. A light-emitting device comprising:
a first electrode;
a first light-emitting layer, the first light-emitting layer comprising a first organic compound, a second organic compound, and a third organic compound;
a second light-emitting layer; and
a second electrode,
wherein the first light-emitting layer and the second light-emitting layer are interposed between the first electrode and the second electrode,
wherein a T1 level of the first organic compound is lower than a T1 level of the second organic compound and higher than a T1 level of the third organic compound,
wherein a lifetime of an emission from the second organic compound is more than or equal to 5 psec and less than or equal to 15 psec where the lifetime is a time required for the emission from the second organic compound to decrease in intensity to 1/100 of an initial value thereof, and
wherein an emission color from the second light-emitting layer is different from an emission color from the first light-emitting layer.
2. The light-emitting device according to claim 1, wherein a difference in T1 level between the first organic compound and the second organic compound is larger than 0 eV and less than or equal to 0.2 eV.
3. The light-emitting device according to claim 1, wherein a rate constant of a radiative transition of the second organic compound is larger than $5 \times 10^5$ sec$^{-1}$.
4. The light-emitting device according to claim 1, wherein a rate constant of a non-radiative transition of the first organic compound is smaller than $1 \times 10^2$ sec$^{-1}$.
5. The light-emitting device according to claim 1, wherein the first organic compound is selected from a compound having a carbazole skeleton, a compound having a polyazole skeleton, a compound having a quinoxaline skeleton, a compound having a dibenzoquinoxaline skeleton, a compound having a diazine skeleton, and a compound having a pyridine skeleton.

6. The light-emitting device according to claim 1, wherein the lifetime of the emission from the second organic compound is less than or equal to 10 μsec.

7. The light-emitting device according to claim 1, wherein the emission color from the first light-emitting layer and the emission color from the second light-emitting layer are complementary so that white light is emitted from the light-emitting device.

8. The light-emitting device according to claim 1, further comprising a charge generation layer between the first light-emitting layer and the second light-emitting layer.

9. The light-emitting device according to claim 1,
wherein an emission from the first light-emitting layer is derived from both of the second organic compound and the third organic compound.

10. The light-emitting device according to claim 1,
wherein the first light-emitting layer comprises a fourth organic compound,
wherein the first organic compound has a hole-transport property,
wherein the fourth organic compound has an electron-transport property, and
wherein a T1 level of the fourth organic compound is lower than the T1 level of the first organic compound, lower than the T1 level of the second organic compound and higher than the T1 level of the third organic compound.

11. The light-emitting device according to claim 1,
wherein the second organic compound is an organometallic compound, and
wherein the third organic compound is an organometallic compound.

12. A light-emitting device comprising:
a first electrode;
a light-emitting layer over the first electrode, the light-emitting layer comprising a first organic compound, a second organic compound, and a third organic compound; and
a second electrode over the light-emitting layer,
wherein a T1 level of the first organic compound is lower than a T1 level of the second organic compound and higher than a T1 level of the third organic compound, and
wherein a lifetime of an emission from the second organic compound is more than or equal to 5 μsec and less than or equal to 15 μsec where the lifetime is a time required for the emission from the second organic compound to decrease in intensity to $1/100$ of an initial value thereof.

13. The light-emitting device according to claim 12,
wherein a difference in T1 level between the first organic compound and the second organic compound is larger than 0 eV and less than or equal to 0.2 eV.

14. The light-emitting device according to claim 12,
wherein a rate constant of a radiative transition of the second organic compound is larger than $5 \times 10^5$ sec$^{-1}$.

15. The light-emitting device according to claim 12,
wherein a rate constant of a non-radiative transition of the first organic compound is smaller than $1 \times 10^2$ sec$^{-1}$.

16. The light-emitting device according to claim 12,
wherein the first organic compound is selected from a compound having a carbazole skeleton, a compound having a polyazole skeleton, a compound having a quinoxaline skeleton, a compound having a dibenzoquinoxaline skeleton, a compound having a diazine skeleton, and a compound having a pyridine skeleton.

17. The light-emitting device according to claim 12,
wherein the lifetime of the emission from the second organic compound is less than or equal to 10 μsec.

18. The light-emitting device according to claim 12,
wherein an emission from the light-emitting layer is derived from both of the second organic compound and the third organic compound.

19. The light-emitting device according to claim 12,
wherein the light-emitting layer comprises a fourth organic compound,
wherein the first organic compound has a hole-transport property,
wherein the fourth organic compound has an electron-transport property, and
wherein a T1 level of the fourth organic compound is lower than the T1 level of the first organic compound, lower than the T1 level of the second organic compound and higher than the T1 level of the third organic compound.

20. The light-emitting device according to claim 12,
wherein the second organic compound is an organometallic compound, and
wherein the third organic compound is an organometallic compound.

* * * * *